(12) United States Patent
Kim et al.

(10) Patent No.: US 12,302,563 B2
(45) Date of Patent: May 13, 2025

(54) THREE-DIMENSIONAL SEMICONDUCTOR MEMORY DEVICES, METHODS OF FABRICATING THE SAME, AND ELECTRONIC SYSTEMS INCLUDING THE SAME

(71) Applicant: Samsung Electronics Co., Ltd., Suwon-si (KR)

(72) Inventors: Donghwan Kim, Seoul (KR);
Shinhwan Kang, Suwon-si (KR);
Youngji Noh, Suwon-si (KR);
Jung-Hwan Park, Suwon-si (KR);
Sanghun Chun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 605 days.

(21) Appl. No.: 17/537,744

(22) Filed: Nov. 30, 2021

(65) Prior Publication Data

US 2022/0216151 A1 Jul. 7, 2022

(30) Foreign Application Priority Data

Jan. 5, 2021 (KR) ........................ 10-2021-0001083

(51) Int. Cl.
*H10B 43/27* (2023.01)
*H10B 43/40* (2023.01)
*H10B 43/50* (2023.01)

(52) U.S. Cl.
CPC ............. *H10B 43/27* (2023.02); *H10B 43/40* (2023.02); *H10B 43/50* (2023.02)

(58) Field of Classification Search
CPC ......... H10B 43/27; H10B 43/40; H10B 43/50
See application file for complete search history.

(56) References Cited

U.S. PATENT DOCUMENTS

| 9,768,233 | B1 | 9/2017 | Fukuda et al. |
| 9,853,038 | B1 | 12/2017 | Cui |
| 10,050,051 | B1 | 8/2018 | Liao et al. |

(Continued)

FOREIGN PATENT DOCUMENTS

| CN | 109411481 A | 3/2019 |
| CN | 113013176 A | 6/2021 |
| KR | 20210079087 A | 6/2021 |

*Primary Examiner* — Zandra V Smith
*Assistant Examiner* — Molly K Reida
(74) *Attorney, Agent, or Firm* — Myers Bigel, P.A.

(57) ABSTRACT

Disclosed are three-dimensional semiconductor memory devices, electronic systems including the same, and methods of fabricating the same. The three-dimensional semiconductor memory device includes a substrate including a cell array region and an extension region, a peripheral circuit structure including peripheral transistors on the substrate, a stack structure including interlayer dielectric layers and gate electrodes that are alternately stacked on the peripheral circuit structure, contacts that penetrate the stack structure on the extension region and are electrically connected with the peripheral transistors and include a protruding part contacting a sidewall of one of the gate electrodes and a vertical part penetrating the stack structure, and dielectric patterns between the vertical part and respective sidewalls of the gate electrodes. Top and bottom surfaces of each of the dielectric patterns are respectively in contact with adjacent ones of the interlayer dielectric layers.

19 Claims, 27 Drawing Sheets

(56) References Cited

U.S. PATENT DOCUMENTS

| | | | |
|---|---|---|---|
| 10,141,326 B1 | 11/2018 | Oh et al. | |
| 10,192,929 B2 | 1/2019 | Mori | |
| 10,283,566 B2 | 5/2019 | Sel et al. | |
| 10,504,914 B2 | 12/2019 | Wang | |
| 2015/0372000 A1* | 12/2015 | Jee | H01L 29/792 257/314 |
| 2016/0079259 A1* | 3/2016 | Son | H10B 43/27 257/401 |
| 2018/0226423 A1 | 8/2018 | Kang et al. | |
| 2019/0267323 A1 | 8/2019 | Smith et al. | |
| 2019/0326316 A1* | 10/2019 | Son | H01L 23/535 |
| 2020/0105783 A1 | 4/2020 | Baek | |
| 2020/0176033 A1 | 6/2020 | Hosotani et al. | |
| 2021/0193672 A1 | 6/2021 | Kim et al. | |
| 2022/0139831 A1* | 5/2022 | Kim | H10B 43/27 257/314 |

* cited by examiner

THREE-DIMENSIONAL SEMICONDUCTOR MEMORY DEVICES, METHODS OF FABRICATING THE SAME, AND ELECTRONIC SYSTEMS INCLUDING THE SAME

CROSS-REFERENCE TO RELATED APPLICATION

This U.S. nonprovisional application claims priority under 35 U.S.C § 119 to Korean Patent Application No. 10-2021-0001083 filed on Jan. 5, 2021, in the Korean Intellectual Property Office, the disclosure of which is hereby incorporated by reference in its entirety.

BACKGROUND

The present inventive concepts are related to three-dimensional semiconductor memory devices, methods of fabricating the same, and electronic systems including the same, and more particularly, to nonvolatile three-dimensional semiconductor memory devices having a vertical channel, methods of fabricating the same, and electronic systems including the same.

Electronic systems that utilize data storage may incorporate semiconductor devices that are capable of storing a large amount of data. Semiconductor devices have been highly integrated to provide both high performance and lower manufacturing costs, which may be preferred by customers. Integration of conventional two-dimensional or planar semiconductor devices may be determined by the area occupied by a unit memory cell, such that the integration is influenced by the level of technology for forming fine patterns. However, the extremely expensive processing equipment utilized to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some embodiments of the present inventive concepts provide a three-dimensional semiconductor memory device whose stability and electric properties are improved and a simplified method of fabricating the same.

Some embodiments of the present inventive concepts provide an electronic system including the three-dimensional semiconductor memory device.

An object of the present inventive concepts is not limited to those embodiments mentioned above, and other objects which have not been mentioned above will be clearly understood by those skilled in the art from the following description.

According to some embodiments of the present inventive concepts, a three-dimensional semiconductor memory device may comprise: a substrate comprising a cell array region and an extension region; a peripheral circuit structure comprising a plurality of peripheral transistors on the substrate; a stack structure comprising a plurality of interlayer dielectric layers and a plurality of gate electrodes that are alternately stacked on the peripheral circuit structure; a plurality of contacts that penetrate the stack structure on the extension region and are electrically connected with the plurality of peripheral transistors, each of the plurality of contacts comprising a protruding part and a vertical part, the protruding part contacting a sidewall of one of the plurality of gate electrodes, and the vertical part penetrating the stack structure; and a plurality of dielectric patterns between the vertical part and respective sidewalls of the plurality of gate electrodes. A top surface and a bottom surface of each of the plurality of dielectric patterns may be respectively in contact with adjacent ones of the plurality of interlayer dielectric layers.

According to some embodiments of the present inventive concepts, a three-dimensional semiconductor memory device may comprise: a first substrate including a cell array region and an extension region; a peripheral circuit structure comprising a plurality of peripheral circuit lines and a plurality of peripheral transistors on the first substrate; a second substrate on the peripheral circuit structure; and a cell array structure on the second substrate. The cell array structure may comprise: a stack structure comprising a plurality of interlayer dielectric layers and a plurality of gate electrodes that are alternately stacked on the second substrate; a plurality of vertical structures that penetrate the stack structure on the cell array region; a plurality of bit lines that are electrically connected to the plurality of vertical structures, respectively; a plurality of contacts that penetrate the second substrate and the stack structure on the extension region and are in contact with the plurality of peripheral circuit lines; and a plurality of dielectric patterns between the plurality of contacts and sidewalls of the plurality of gate electrodes, respectively. Each of the plurality of contacts may include: a protruding part in contact with the sidewall of one of the gate electrodes; and a vertical part that penetrates the stack structure. A top surface and a bottom surface of each of the plurality of dielectric patterns may be respectively in contact with adjacent ones of the plurality of interlayer dielectric layers.

According to some embodiments of the present inventive concepts, an electronic system may comprise: a main board; a three-dimensional semiconductor memory device on the main board; and a controller on the main board and electrically connected to the three-dimensional semiconductor memory device. The three-dimensional semiconductor memory device may comprise: a substrate comprising a cell array region and an extension region; a peripheral circuit structure comprising a plurality of peripheral transistors on the substrate; a stack structure comprising a plurality of interlayer dielectric layers and a plurality of gate electrodes that are alternately stacked on the peripheral circuit structure; a plurality of contacts that penetrate the stack structure on the extension region and are electrically connected with the plurality of peripheral transistors, each of the plurality of contacts comprising a protruding part and a vertical part, the protruding part contacting a sidewall of one of the plurality of gate electrodes, and the vertical part penetrating the stack structure; and a plurality of dielectric patterns between the vertical part and respective sidewalls of the plurality of gate electrodes. A top surface and a bottom surface of each of the plurality of dielectric patterns may be respectively in contact with adjacent ones of the plurality of interlayer dielectric layers.

DETAILED DESCRIPTION

With reference to the accompanying drawings, the following will now describe in detail three-dimensional semiconductor memory devices, methods of fabricating the same, and electronic systems including the same according to some embodiments of the present inventive concepts.

Figure 1:
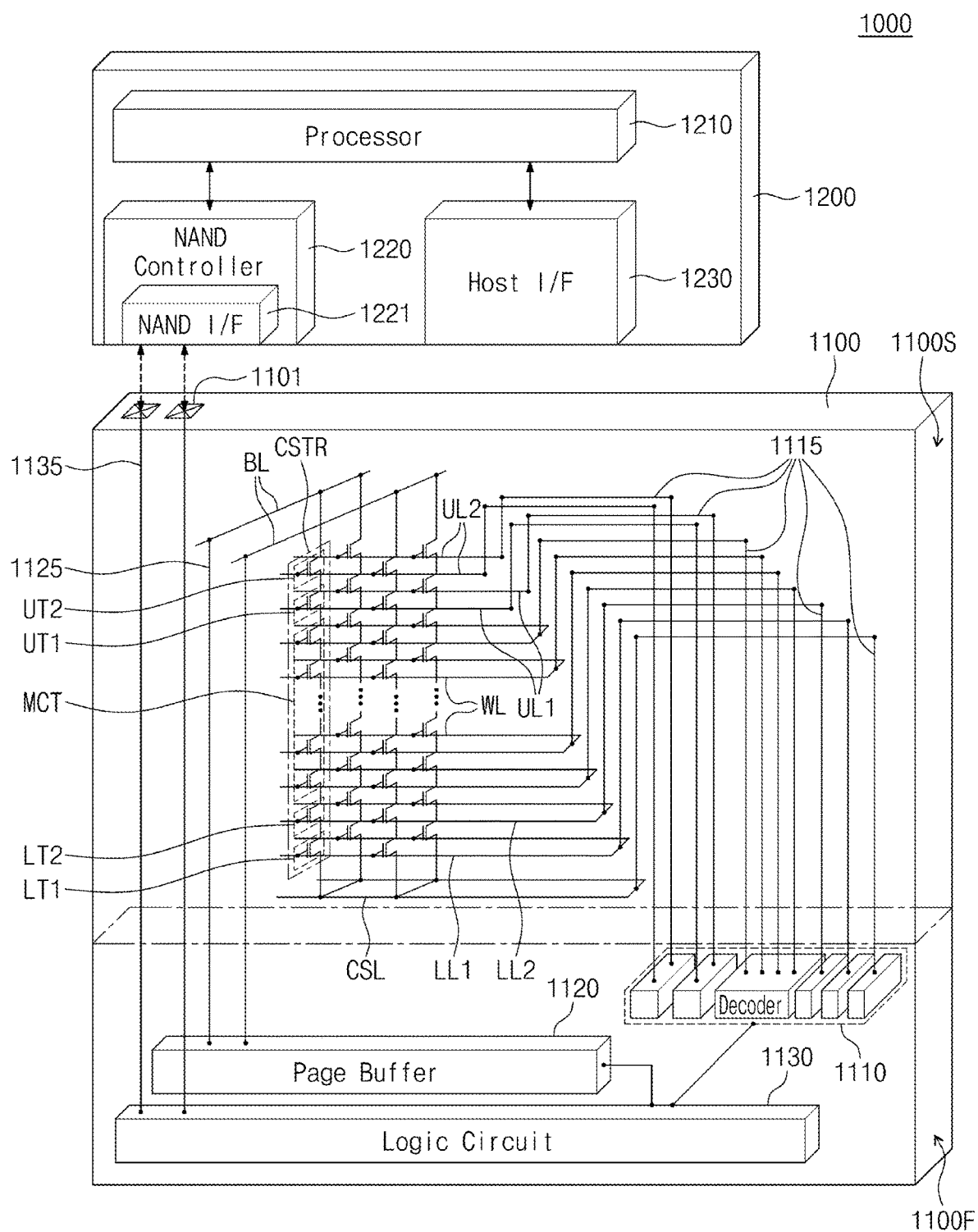
FIG. 1 illustrates a simplified block diagram showing an electronic system that includes a three-dimensional semiconductor memory device according to some embodiments of the present inventive concepts.

FIG. 1 illustrates a simplified block diagram showing an electronic system 1000 that includes a three-dimensional semiconductor memory device 1100 according to some embodiments of the present inventive concepts.

Referring to FIG. 1, an electronic system 1000 according to some embodiments of the present inventive concepts may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a universal serial bus (USB) device, a computing system, a medical apparatus, and/or a communication apparatus, each of which includes a single or a plurality of three-dimensional semiconductor memory devices 1100.

The three-dimensional semiconductor memory device 1100 may be a nonvolatile memory device, such as a three-dimensional NAND Flash memory device which will be discussed below. The three-dimensional semiconductor memory device 1100 may include a first region 1100F and a second region 1100S on the first region 1100F. For example, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and memory cell transistors MCT disposed between the first transistors LT1 and LT2 and the second transistors UT1 and UT2. The number of the first transistors LT1 and LT2 and of the second transistors UT1 and UT2 may be variously changed in accordance with some embodiments of the present inventive concepts.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erasure control transistor LT1 and a ground selection transistor LT2 that are connected in series. The second transistors UT1 and UT2 may include a string selection transistor UT1 and a second erasure control transistor UT2 that are connected in series. One or both of the first and second erasure control transistors LT1 and UT2 may be employed to perform an erase operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through one or more input/output connection lines 1135 that extend from the first region 1100F toward the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control an overall operation of the electronic system 1000 including the controller 1200. The processor 1210 may operate based on certain firmware, and may control the NAND controller 1220 to access the three-dimensional semiconductor memory device 1100. The NAND controller 1220 may include NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
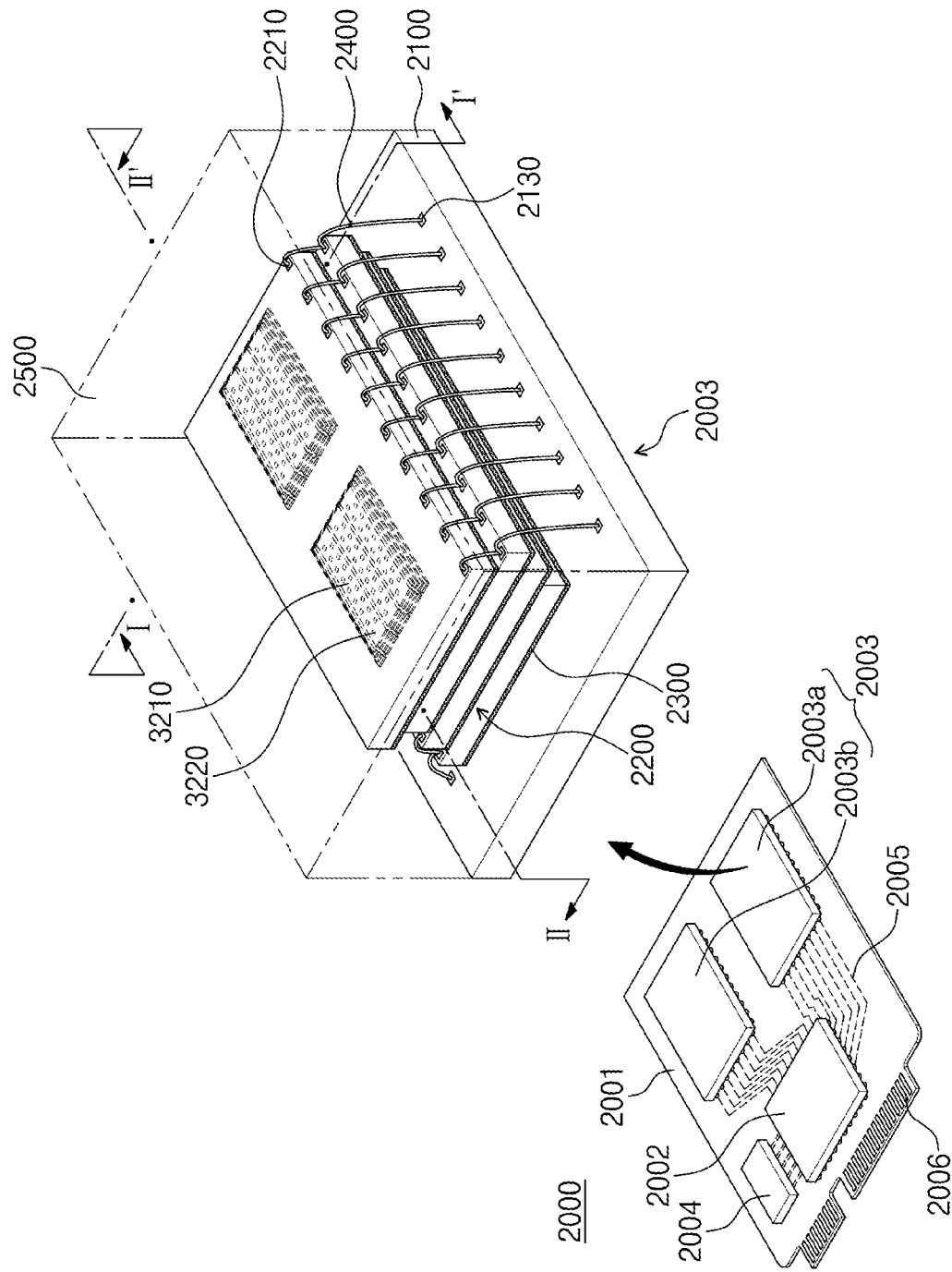
FIG. 2 illustrates a simplified perspective view showing an electronic system that includes a three-dimensional semiconductor memory device according to some embodiments of the present inventive concepts.

FIG. 2 illustrates a simplified perspective view showing an electronic system 2000 that includes a three-dimensional semiconductor memory device according to some embodiments of the present inventive concepts.

Referring to FIG. 2, an electronic system 2000 according to some embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and an external host. The electronic system 2000 may communicate with the external host through one or more interfaces such as, for example, universal serial bus (USB), peripheral component interconnect express (PCI-Express), serial advanced technology attachment (SATA), and/or M-PHY for universal flash storage (UFS). For example, the electronic system 2000 may operate with power supplied through the connector 2006 from an external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, and/or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor package 2003a and 2003b may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device which will be discussed below.

For example, the connection structures 2400 may be bonding wires that electrically connect the input/output pads 2210 to the package upper pads 2130. On each of the first and second semiconductor packages 2003a and 2003b, the semiconductor chips 2200 may be electrically connected to each other in a wire bonding manner, and may be electrically connected to the package upper pads 2130 of the package substrate 2100. In some embodiments, on each of the first and second semiconductor packages 2003a and 2003b, the semiconductor chips 2200 may be electrically connected to each other using through-silicon vias (TSVs) instead of the connection structures 2400 or the bonding wires.

For example, the controller 2002 and the semiconductor chips 2200 may be included in a single package. For example, the controller 2002 and the semiconductor chips 2200 may be mounted on a separate interposer substrate other than the main board 2001, and may be connected to each other through wiring lines provided in the interposer substrate.

Figure 3:
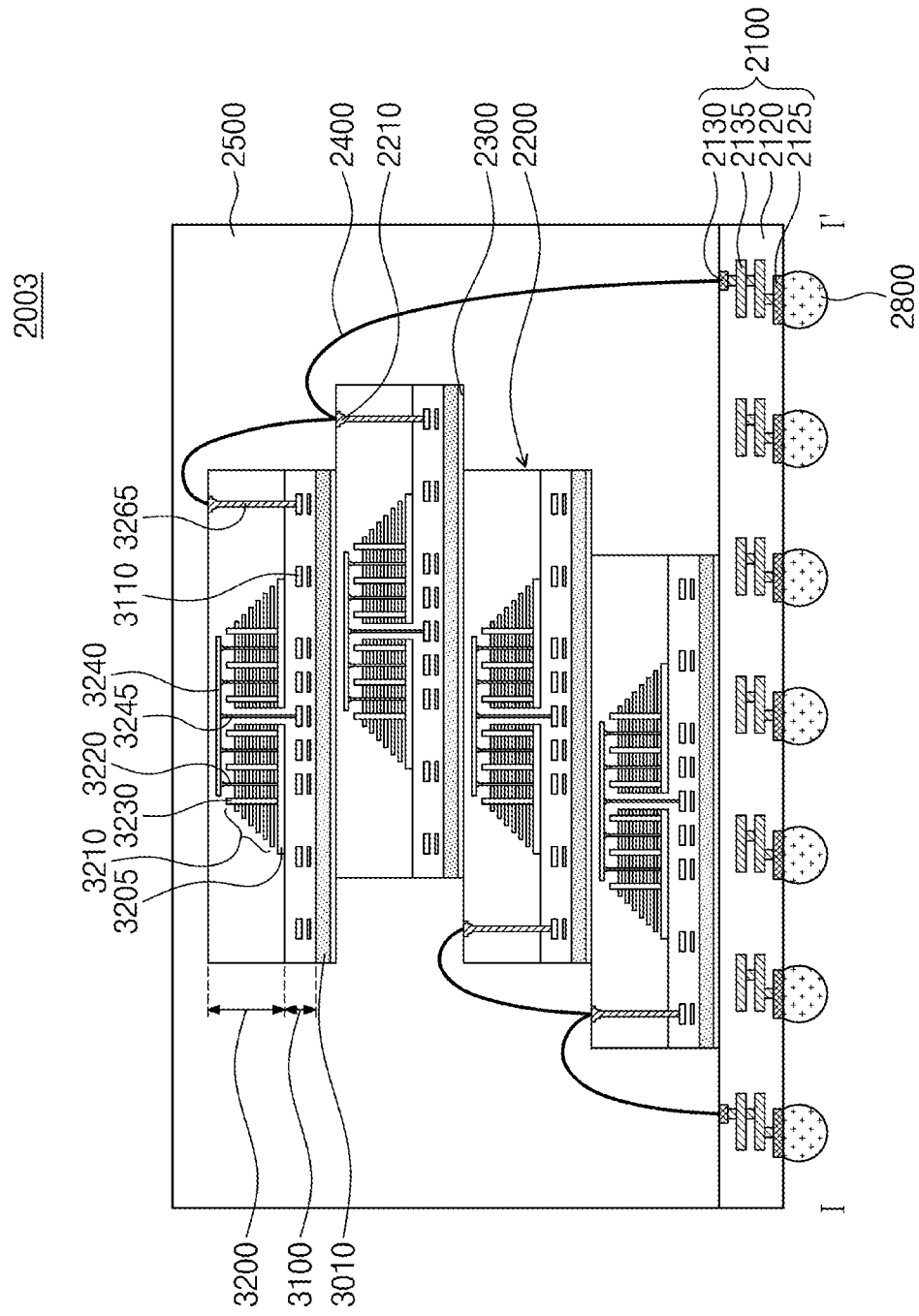
FIGS. 3 and 4 illustrate cross-sectional views respectively taken along lines I-I' and II-II' of FIG. 2, showing a semiconductor package that includes a three-dimensional semiconductor memory device according to some embodiments of the present inventive concepts.
Figure 4:
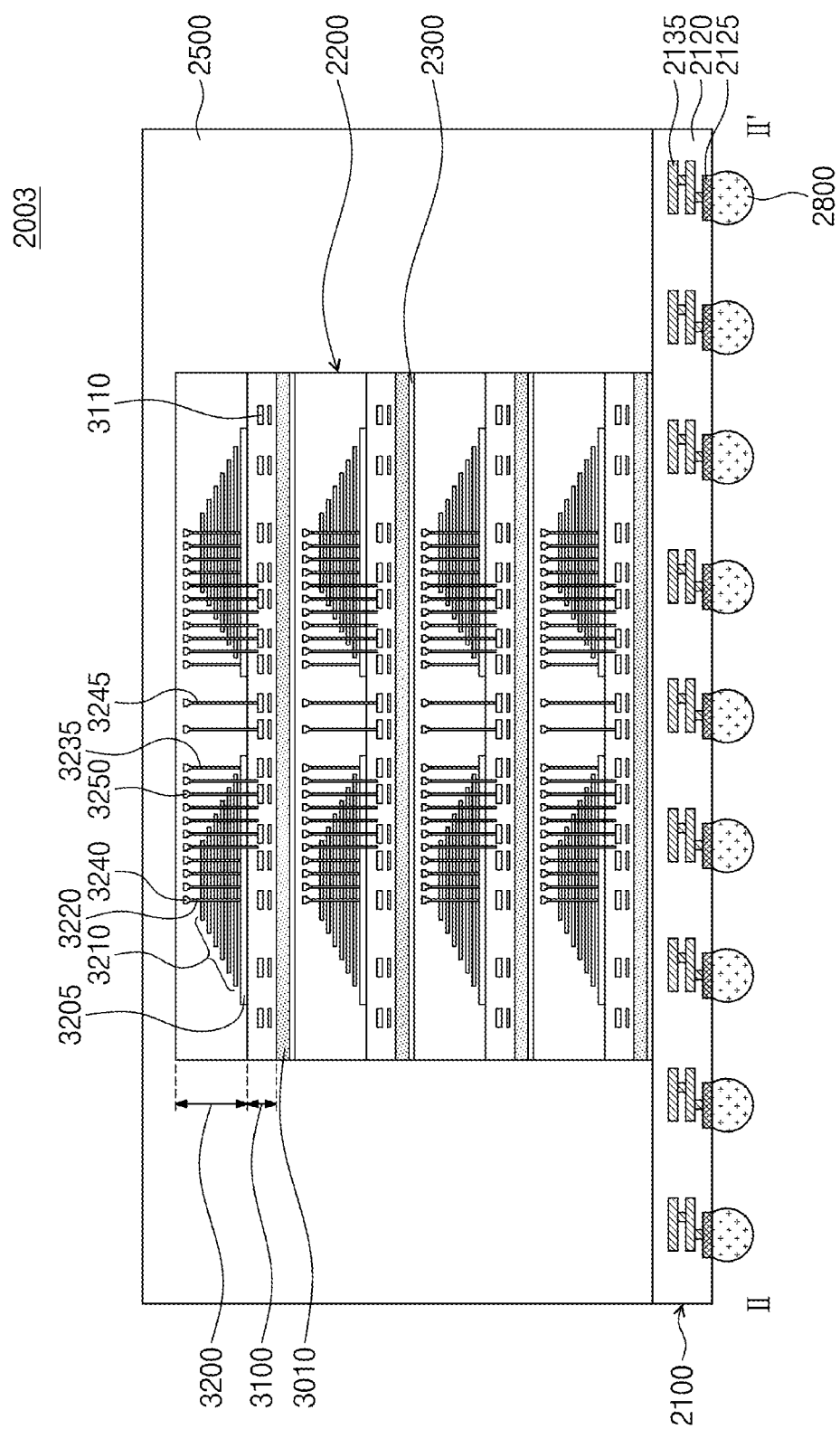

FIGS. 3 and 4 illustrate cross-sectional views respectively taken along lines I-I' and II-II' of FIG. 2, showing a semiconductor package 2003 that includes a three-dimensional semiconductor memory device according to some embodiments of the present inventive concepts.

Referring to FIGS. 3 and 4, a semiconductor package 2003 may include a package substrate 2100, a plurality of semiconductor chips 2200 on the package substrate 2100, and a molding layer 2500 that is on, and in some embodiments covers, the package substrate 2100 and the plurality of semiconductor chips 2200.

The package substrate 2100 may include a package substrate body 2120, package upper pads 2130 disposed on a top surface of the package substrate body 2120, package lower pads 2125 disposed or exposed on a bottom surface of the package substrate body 2120, and internal lines 2135 that lie in the package substrate body 2120 and electrically connect the package upper pads 2130 to the package lower pads 2125. The package upper pads 2130 may be electrically connected to connection structures 2400. The package lower pads 2125 may be connected through conductive connectors 2800 to the wiring patterns 2005 in the main board 2001 of the electronic system 2000 depicted in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral lines 3110. The second structure 3200 may include a common source line 3205, a gate stack structure 3210 on the common source line 3205, vertical channel structures 3220 and separation structures 3230 that penetrate the gate stack structure 3210, bit lines 3240 electrically connected to the vertical channel structures 3220, and conductive lines 3250 and gate connection lines 3235 electrically connected to word lines (see WL of FIG. 1) of the gate stack structure 3210. Ones of the gate connection lines 3235 may be electrically connected to ones of the word lines WL, and may penetrate other word lines WL and may have electrical connection with the peripheral lines 3110 of the first structure 3100. At least one of the gate connection lines 3235 may be electrically connected to the common source line 3205. The gate connection lines 3235 electrically connected to the word lines WL may be formed simultaneously with through lines 3245 which will be discussed below.

Each of the semiconductor chips 2200 may include one or more through lines 3245 that have electrical connection with the peripheral lines 3110 of the first structure 3100 and extend into the second structure 3200. The through line 3245 may penetrate the gate stack structure 3210, and may further be disposed outside the gate stack structure 3210. Each of the semiconductor chips 2200 may further include an input/output connection line 3265 that has an electrical connection with the peripheral line 3110 of the first structure 3100 and extends into the second structure 3200, and may also further include an input/output pad 2210 electrically connected to the input/output connection line 3265.

Figure 5:
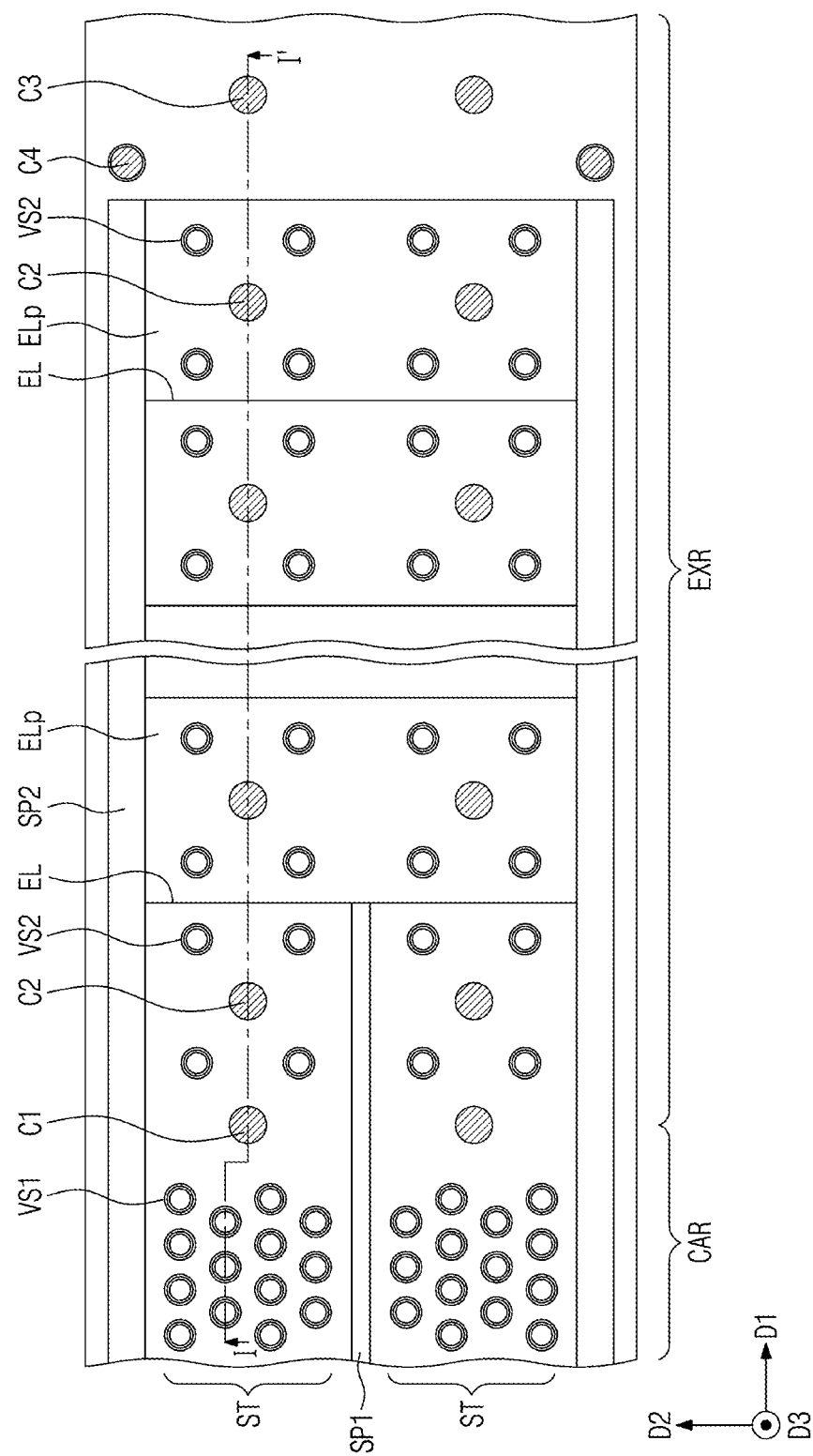
FIG. 5 illustrates a plan view showing a three-dimensional semiconductor memory device according to some embodiments of the present inventive concepts.
Figure 6:
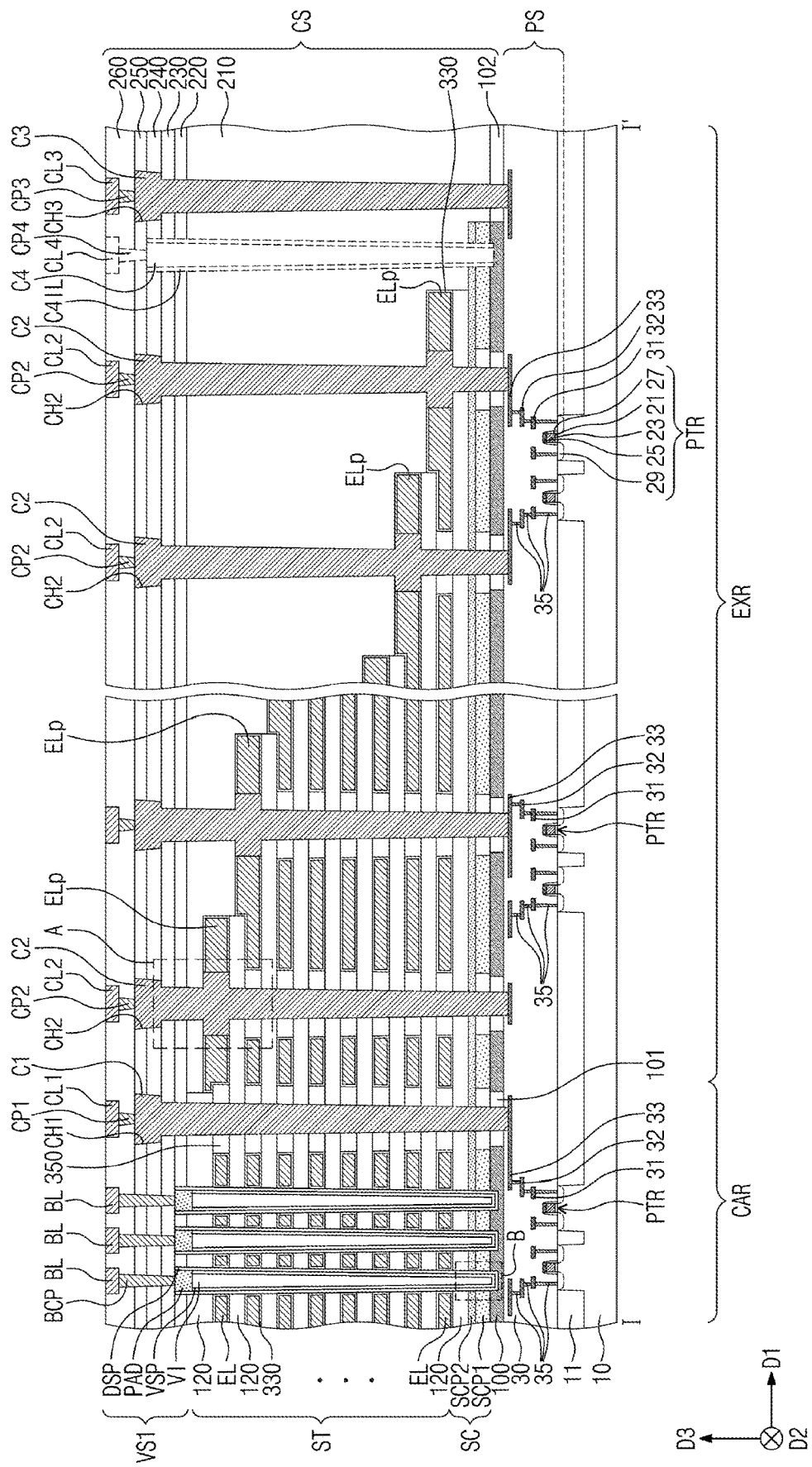
FIG. 6 illustrates a cross-sectional view taken along line I-I' of FIG. 5, showing a three-dimensional semiconductor memory device according to some embodiments of the present inventive concepts.

FIG. 5 illustrates a plan view showing a three-dimensional semiconductor memory device according to some embodiments of the present inventive concepts. FIG. 6 illustrates a cross-sectional view taken along line I-I' of FIG. 5, showing a three-dimensional semiconductor memory device according to some embodiments of the present inventive concepts.

Referring to FIGS. 5 and 6, a first substrate 10 may be provided which includes a cell array region CAR and an extension region EXR. The first substrate 10 may have a top surface that is parallel to first and second directions D1 and D2 and is perpendicular to a third direction D3. The first, second, and third directions D1, D2, and D3 may be orthogonal to each other. The extension region EXR may extend in the first direction D1 from the cell array region CAR.

The first substrate 10 may be, for example, a silicon substrate, a silicon-germanium substrate, a germanium substrate, or a mono-crystalline epitaxial layer grown on a mono-crystalline silicon substrate. A device isolation layer 11 may be disposed in the first substrate 10. The device isolation layer 11 may define active sections of the first substrate 10. The device isolation layer 11 may include an oxide, such as silicon oxide.

A peripheral circuit structure PS may be provided on the first substrate 10. The peripheral circuit structure PS may correspond to the first region 1100F of FIG. 1. The peripheral circuit structure PS may include peripheral transistors PTR on the active sections of the first substrate 10, first, second, and third peripheral circuit lines 31, 32, and 33, peripheral contact plugs 35, and a peripheral circuit dielectric layer 30 that surround the peripheral transistors PTR, the first, second, and third peripheral circuit lines 31, 32, and 33, and the peripheral contact plugs 35. It will be understood that "an element A surrounds an element B" (or similar language) as used herein means that the element A is at least partially around the element B but does not necessarily mean that the element A completely encloses the element B.

A peripheral circuit may be constituted by the peripheral transistors PTR, the first, second, and third peripheral circuit lines 31, 32, and 33, and the peripheral contact plugs 35. For example, the peripheral transistors PTR may constitute the decoder circuit 1110, the page buffer 1120, and the logic circuit 1130 that are depicted in FIG. 1. For example, each of the peripheral transistors PTR may include a peripheral gate dielectric layer 21, a peripheral gate electrode 23, a peripheral capping pattern 25, a peripheral gate spacer 27, and peripheral source/drain regions 29.

The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover a sidewall of the peripheral gate dielectric layer 21, of the peripheral gate electrode 23, and of the peripheral capping pattern 25. The peripheral source/drain regions 29 may be provided in the first substrate 10 adjacent to opposite sides of the peripheral gate electrode 23.

The first, second, and third peripheral circuit lines 31, 32, and 33 may be electrically connected through the peripheral contact plugs 35 to the peripheral transistors PTR. Each of the peripheral transistors PTR may be, for example, an NMOS transistor, a PMOS transistor, or a gate-all-around type transistor. For example, the peripheral contact plugs 35 may each have a width in the first direction D1 or the second direction D2 that increases in the third direction D3. The first, second, and third peripheral circuit lines 31, 32, and 33 and the peripheral contact plugs 35 may include a conductive material, such as metal.

A peripheral circuit dielectric layer 30 may be provided on the top surface of the first substrate 10. On the first substrate 10, the peripheral circuit dielectric layer 30 may cover the peripheral transistors PTR, the first, second, and third peripheral circuit lines 31, 32, and 33, and the peripheral contact plugs 35. The peripheral circuit dielectric layer 30 may include a plurality of dielectric layers that constitutes a multi-layered structure. For example, the peripheral circuit dielectric layer 30 may include a dielectric material, such as one or more of silicon oxide, silicon nitride, silicon oxynitride, and/or low-k dielectrics.

The peripheral circuit dielectric layer 30 may be provided thereon with a second substrate 100 and also with first and second dielectric patterns 101 and 102. The first and second dielectric patterns 101 and 102 may define positions of first, second, and third contacts C1, C2, and C3 which will be discussed below. The first and second dielectric patterns 101 and 102 may have their top surfaces substantially coplanar with a top surface of the second substrate 100 and a bottom surface of a source structure SC which will be discussed below. The first and second dielectric patterns 101 and 102 may have their bottom surfaces substantially coplanar with that of the second substrate 100.

The first dielectric patterns 101 may be provided between the peripheral circuit dielectric layer 30 and a source structure SC which will be discussed below. When viewed in plan, each of the first dielectric patterns 101 may be surrounded by the second substrate 100. The second dielectric pattern 102 may extend in the first direction D1 from one sidewall of the second substrate 100.

The second substrate 100 may be a semiconductor substrate including a semiconductor material. The second substrate 100 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof. The first and second dielectric patterns 101 and 102 may include oxide, such as silicon oxide.

The peripheral circuit structure PS may be provided thereon with a cell array structure CS that includes stack structures ST, first and second vertical structures VS1 and VS2, and first, second, third, and fourth contacts C1, C2, C3, and C4. The cell array structure CS may correspond to the second region 1100S of FIG. 1. The following will discuss in detail components of the cell array structure CS.

A plurality of stack structures ST may be disposed on the second substrate 100. The stack structures ST may correspond to the gate stack structures 3210 of FIGS. 2 to 4. As viewed in plan as shown in FIG. 5, the stack structures ST may be arranged along the second direction D2. A first separation pattern SP1 or a second separation pattern SP2 may be provided between the stack structures ST that are adjacent to each other in the second direction D2. For example, the stack structures ST may be spaced apart in the second direction D2 from each other across the first separation pattern SP1 or the second separation pattern SP2. The second separation pattern SP2 may have a length in the first direction D1 greater than a length in the first direction D1 of the first separation pattern SP1. The first and second separation patterns SP1 and SP2 may include oxide, such as silicon oxide. For convenience of description, the following explanation will focus on a single stack structure ST, but this explanation may also be applicable to other stack structures ST.

The stack structure ST may include interlayer dielectric layers 120 and gate electrodes EL that are alternately stacked. The gate electrodes EL may correspond to the word lines WL, the first lines LL1 and LL2, and the second lines UL1 and UL2 that are shown in FIG. 1.

The gate electrodes EL may have their lengths in the first direction D1 that decrease with increasing distance from the second substrate 100 (e.g., decrease in the third direction D3). For example, the length in the first direction D1 of one gate electrode EL may be greater than the length in the first direction D1 of a next gate electrode EL directly above the one gate electrode EL. A lowermost gate electrode EL of the stack structure ST may have the largest length in the first direction D1, and an uppermost gate electrode EL of the stack structure ST may have the smallest length in the first direction D1.

Each of the gate electrodes EL may include a pad portion ELp on the connection region EXR. The pad portion ELp may have a thickness (e.g., in the third direction D3) greater than those of other portions of each gate electrode EL. The pad portions ELp may be horizontally and vertically located at different positions. The pad portions ELp may constitute a stepwise structure along the first direction D1.

The stepwise structure may cause the stack structure ST to have a thickness that decreases with increasing distance from an outermost one of first vertical structures VS1 which will be discussed below. In the description below, the term "thickness" may indicate a thickness in the third direction D3. The gate electrodes EL may have their sidewalls that are equally spaced apart from each other along the first direction D1 when viewed in plan.

The gate electrodes EL may include, for example, at least one selected from doped semiconductor (e.g., doped silicon), metal (e.g., tungsten, copper, and/or aluminum), conductive metal nitride (e.g., titanium nitride and/or tantalum nitride), and transition metal (e.g., titanium and/or tantalum).

A barrier layer 330 may be provided to conformally extend on top and bottom surfaces of each of the gate electrodes EL. The barrier layer 330 may extend along sidewalls of first and second vertical structures VS1 and VS2 which will be discussed below and along sidewalls of third dielectric patterns 350 which will be discussed below. For example, the barrier layer 330 may be interposed between the gate electrodes EL and the interlayer dielectric layers 120, between the gate electrodes EL and the sidewalls of first and second vertical structures VS1 and VS2, and between the gate electrodes EL and the sidewalls of third dielectric patterns 350. The barrier layer 330 may include metal oxide, such as aluminum oxide ($Al_xO_y$).

The interlayer dielectric layers 120 may be provided between the gate electrodes EL, and each of the interlayer dielectric layers 120 may have a sidewall aligned with that of the gate electrode EL in contact with an upper portion thereof. For example, likewise the gate electrodes EL, the interlayer dielectric layers 120 may have their lengths in the first direction D1 that decrease with increasing distance from the second substrate 100.

For example, a lowermost (e.g., closest to the second substrate 100) one of the interlayer dielectric layers 120 may have a thickness less than those of other interlayer dielectric layers 120. An uppermost (e.g., farthest from the second substrate 100) one of the interlayer dielectric layers 120 may be greater than those of other interlayer dielectric layers 120. Except the lowermost and uppermost ones of the interlayer dielectric layers 120, the others of the interlayer dielectric layers 120 may have substantially the same thickness. However, this is merely an example, and the interlayer dielectric layers 120 may have their thicknesses that are changed depending on characteristics of a semiconductor device.

The interlayer dielectric layers 120 may include a dielectric material, such as one or more of silicon oxide, silicon nitride, silicon oxynitride, and low-k dielectrics. For example, the interlayer dielectric layers 120 may include high density plasma (HDP) oxide or tetraethyl orthosilicate (TEOS).

A source structure SC may be provided between the second substrate 100 and the lowermost one of the interlayer dielectric layers 120. The source structure SC may correspond to the common source line CSL of FIG. 1 or the common source line 3205 of FIGS. 3 and 4. The source structure SC may extend in the first direction D1 parallel to the gate electrodes EL of the stack structure ST. The source structure SC may include a first source conductive pattern SCP1 and a second source conductive pattern SCP2 that are sequentially stacked. The second source conductive pattern SCP2 may be provided between the first source conductive pattern SCP1 and the lowermost one of the interlayer dielectric layers 120. The first source conductive pattern SCP1 may have a thickness greater than that of the second source conductive pattern SCP2. Each of the first and second source conductive patterns SCP1 and SCP2 may include an impurity-doped semiconductor material. For example, the first source conductive pattern SCP1 may have an impurity concentration greater than that of the second source conductive pattern SCP2.

On the cell array region CAR, a plurality of first vertical structures VS1 may be provided to penetrate the stack structure ST and the source structure SC. The first vertical structures VS1 may penetrate at least a portion of the second substrate 100, and each of the first vertical structures VS1 may have a bottom surface at a lower level than that of a bottom surface of the source structure SC.

When viewed in plan as shown in FIG. 5, the first vertical structures VS1 may be arranged in a zigzag fashion along the first direction D1 or the second direction D2. The first vertical structures VS may not be provided on the extension region EXR. The first vertical structures VS1 may correspond to the vertical channel structures 3220 of FIGS. 1 to 4. The first vertical structures VS1 may correspond to channels of the first transistors LT1 and LT2, channels of the memory cell transistors MCT, and channels of the second transistors UT1 and UT2 that are depicted in FIG. 1.

The first vertical structures VS1 may have their widths in the first direction D1 or the second direction D2 that increase in the third direction D3. Each of the first vertical structures VS1 may have a flat sidewall with no step difference, but the present inventive concepts are not limited thereto. As discussed below with reference to FIG. 9, each of the first vertical structures VS1 may have a sidewall that has a step difference at one or more positions.

Each of the first vertical structures VS1 may include a data storage pattern DSP adjacent to the stack structure ST, a vertical semiconductor pattern VSP that is on and, in some embodiments, conformally covers an inner wall of the data storage pattern DSP, a buried dielectric pattern VI that is within and, in some embodiments, fills an internal space surrounded by the vertical semiconductor pattern VSP, and a conductive pad PAD provided in a space surrounded by the buried dielectric pattern VI and the data storage pattern DSP. A top surface of each of the first vertical structures VS1 may have, for example, a circular shape, an oval shape, or a bar shape.

The vertical semiconductor pattern VSP may be provided between the data storage pattern DSP and the buried dielectric pattern VI. The vertical semiconductor pattern VSP may have a macaroni shape or a pipe shape whose bottom end is closed. The data storage pattern DSP may have a macaroni shape or a pipe shape whose bottom end is opened. The vertical semiconductor pattern VSP may include, for example, an impurity-doped semiconductor material, an impurity-undoped intrinsic semiconductor material, or a polycrystalline semiconductor material. As discussed below with reference to FIG. 8, the vertical semiconductor pattern VSP may be in partial contact with the source structure SC. The conductive pad PAD may include, for example, an impurity-doped semiconductor material and/or a conductive material.

On the extension region EXR, a plurality of second vertical structures VS2 may be provided to penetrate the stack structure ST and the source structure SC. For example, the second vertical structures VS2 may penetrate corresponding pad portions ELp of the gate electrodes EL. When viewed in plan as shown in FIG. 5, the second vertical structures VS2 may be disposed around the second contacts C2. The second vertical structures VS2 may not be provided on the cell array region CAR. The second vertical structures VS2 may be formed simultaneously with the first vertical structures VS1, and may have substantially the same structure as that of the first vertical structures VS1. In some embodiments, the second vertical structures VS2 may not be provided.

On the extension region EXR, a planarized dielectric layer 210 may be provided to cover the stack structure ST and the second dielectric pattern 102. For example, the planarized dielectric layer 210 may cover the stepwise structure and may be provided on the pad portion ELp of each of the gate electrodes EL included in the stack structure ST. The planarized dielectric layer 210 may have a substantially flat top surface. The top surface of the planarized dielectric layer 210 may be substantially coplanar with an uppermost surface of the stack structure ST. For example, the top surface of the planarized dielectric layer 210 may be substantially coplanar with a top surface of the uppermost one of the interlayer dielectric layers 120 included in the stack structure ST.

The planarized dielectric layer 210 may include a single dielectric layer or a plurality of stacked dielectric layers. The planarized dielectric layer 210 may include a dielectric material, such as one or more of silicon oxide, silicon nitride, silicon oxynitride, and low-k dielectrics. The planarized dielectric layer 210 may include a dielectric material different from that of the interlayer dielectric layers 120. For example, when the interlayer dielectric layers 120 of the stack structure ST include high density plasma oxide, the planarized dielectric layer 210 may include tetraethyl orthosilicate (TEOS).

A first upper dielectric layer 220 may be provided on the planarized dielectric layer 210 and the stack structure ST. The first upper dielectric layer 220 may be on and, in some embodiments, cover the top surface of the planarized dielectric layer 210 and the top surface of the uppermost interlayer dielectric layer 120 of the stack structure ST. The first upper dielectric layer 220 may have a top surface substantially coplanar with those of the first and second vertical structures VS1 and VS2.

The first upper dielectric layer 220 may be sequentially provided thereon with a second upper dielectric layer 230, a third upper dielectric layer 240, a fourth upper dielectric layer 250, and a fifth upper dielectric layer 260.

The second upper dielectric layer 230 may be on and, in some embodiments, cover the top surface of the first upper dielectric layer 220 and the top surfaces of the first and second vertical structures VS1 and VS2. For example, the second upper dielectric layer 230 may cover a top surface of the conductive pad PAD of each of the first and second vertical structures VS1 and VS2. The third upper dielectric layer 240 may be on and, in some embodiments, cover a top surface of the second upper dielectric layer 230. The third upper dielectric layer 240 may have a top surface substantially coplanar with that of the fourth contact C4 which will be discussed below. The fourth upper dielectric layer 250 may be on and, in some embodiments, cover the top surface of the third upper dielectric layer 240 and the top surface of the fourth contact C4. The fourth upper dielectric layer 250 may have a top surface substantially coplanar with those of the first, second, and third contacts C1, C2, and C3 which will be discussed below. The fifth upper dielectric layer 260 may be on and, in some embodiments, cover the top surface of the fourth upper dielectric layer 250 and the top surfaces of the first, second, and third contacts C1, C2, and C3.

Each of the first, second, third, fourth, and fifth upper dielectric layers 220, 230, 240, 250, and 260 may include a single dielectric layer or a plurality of stacked dielectric layers. Each of the first, second, third, fourth, and fifth upper dielectric layers 220, 230, 240, 250, and 260 may include a dielectric material, such as one or more of silicon oxide, silicon nitride, silicon oxynitride, and low-k dielectrics. For example, each of the first, second, third, fourth, and fifth upper dielectric layers 220, 230, 240, 250, and 260 may include a dielectric material substantially the same as that of the planarized dielectric layer 210 and different from that of the interlayer dielectric layers 120.

On the cell array region CAR, the first contact C1 may be provided to penetrate the first, second, third, and fourth upper dielectric layers 220, 230, 240, and 250 and the stack structure ST, and to have an electrical connection with the peripheral transistor PTR of the peripheral circuit structure PS. The first contact C1 may be provided in a first channel hole CH1.

On the extension region EXR, a plurality of second contacts C2 may be provided to penetrate the first, second, third, and fourth upper dielectric layers 220, 230, 240, and 250, the planarized dielectric layer 210, and the stack structure ST, and to have an electrical connection with the peripheral transistor PTR of the peripheral circuit structure PS. The second contacts C2 may be correspondingly provided in second channel holes CH2.

Figure 7:
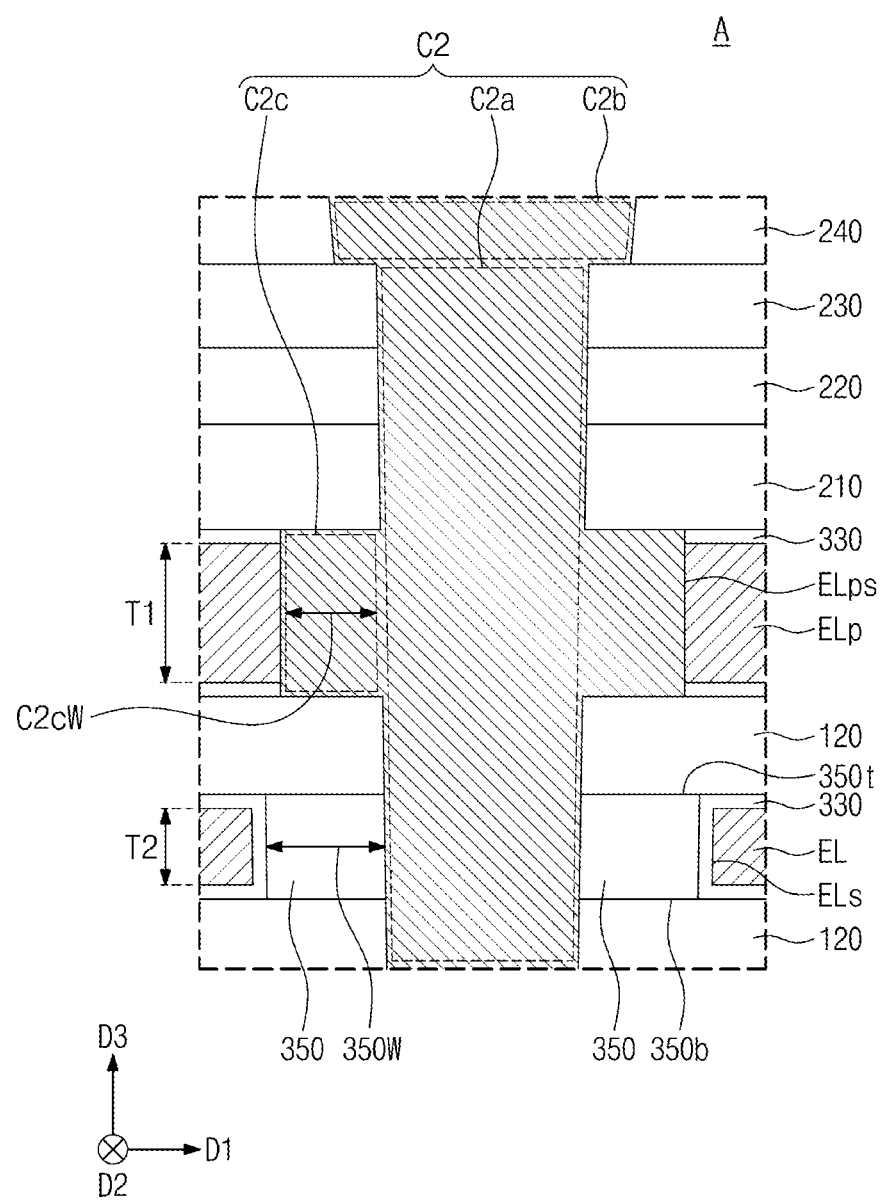
FIGS. 7 and 8 illustrate enlarged views respectively of sections A and B of FIG. 6, showing a three-dimensional semiconductor memory device according to some embodiments of the present inventive concepts.

The second contacts C2 may penetrate corresponding pad portions ELp of the gate electrodes EL. Each of the second contacts C2 may include a protruding part that contacts the pad portion ELp and a vertical part that penetrates the stack structure ST. With reference to FIG. 7, the following will further discuss in detail the protruding and vertical parts of each of the second contacts C2. The second contact C2 that is nearest to the cell array region CAR may be spaced apart in the first direction D1 from the first contact C1. The second contacts C2 may be spaced apart from each other in the first direction D1.

On the extension region EXR, the third contact C3 may be provided to penetrate the first, second, third, and fourth upper dielectric layers 220, 230, 240, and 250, the planarized dielectric layer 210, and the second dielectric pattern 102, and to have an electrical connection with the peripheral transistor PTR of the peripheral circuit structure PS. The third contact C3 may be provided in a third channel hole CH3. The third contact C3 may be spaced in the first direction D1 from the second contact C2 that is farthest from the cell array region CAR.

On the extension region EXR, the fourth contact C4 may be provided to penetrate the first, second, third, and fourth upper dielectric layers 220, 230, 240, and 250, the planarized dielectric layer 210, and the source structure SC, and to have an electrical connection with the second substrate 100. The fourth contact C4 may penetrate at least a portion of the second substrate 100, and may have a bottom surface at a lower level than that of the bottom surface of the source structure SC. The top surface of the fourth contact C4 may be located at a level between that of the top surfaces of the first vertical structures VS1 and that of the top surfaces of the first, second, and third contacts C1, C2, and C3. The fourth contact C4 may be spaced apart from the source structure SC across a contact dielectric layer C4IL that surrounds a sidewall of the fourth contact C4.

The first, second, third, and fourth contacts C1, C2, C3, and C4 may have their widths in the first direction D1 or the second direction D2 that increases in the third direction D3. The first, second, third, and fourth contacts C1, C2, C3, and C4 may include a conductive material, such as metal, metal nitride, metal silicide, and/or impurity-doped polysilicon. The number of each of the first, second, third, and fourth contacts C1, C2, C3, and C4 is not limited to that shown.

The first, second, and third contacts C1, C2, and C3 may be in contact with the third peripheral circuit lines 33 of the peripheral circuit structure PS, and may be electrically connected to the peripheral transistors PTR through the first, second, and third peripheral circuit lines 31, 32, and 33 and the peripheral contact plugs 35. The first, second, and third contacts C1, C2, and C3 may have substantially the same height in the third direction D3. The top surfaces of the first, second, and third contacts C1, C2, and C3 may be located at levels higher than those of the top surfaces of the first vertical structures VS1. The first, second, and third contacts C1, C2, and C3 may each have a step difference (e.g., in width) at a boundary between the second and third upper dielectric layers 230 and 240.

When viewed in horizontal section, the third dielectric patterns 350 may be provided between (e.g., horizontally between) the gate electrodes EL and the first and second contacts C1 and C2. The barrier layer 330 may cover at least a portion of a sidewall of each of the third dielectric patterns 350. The sidewall, in contact with the barrier layer 330, of each of the third dielectric patterns 350 may be spaced apart from a sidewall of each of the first and second contacts C1 and C2.

When viewed in vertical section, the third dielectric patterns 350 may each be provided between (e.g., vertically between) the interlayer dielectric layers 120. As discussed below with reference to FIG. 7, each of the third dielectric patterns 350 may have top and bottom surfaces in contact with the interlayer dielectric layers 120. The third dielectric patterns 350 in contact with the vertical part of the second contact C2 may overlap in the third direction D3 with the first dielectric patterns 101 and the protruding part of the second contact C2. The third dielectric patterns 350 may include oxide, such as silicon oxide. The third dielectric patterns 350 may each have a single-layered structure including an oxide.

Bit-line contact plugs BCP may be provided to penetrate the second, third, fourth, and fifth upper dielectric layers 230, 240, 250, and 260 and to have connection with the first vertical structures VS1. The bit-line contact plugs BCP may be in direct contact with corresponding conductive pads PAD of the first vertical structures VS1.

First, second, third, and fourth contact plugs CP1, CP2, CP3, and CP4 may be provided to penetrate the fifth upper dielectric layer 260 and to respectively have connection with the first, second, third, and fourth contacts C1, C2, C3, and C4. The first, second, and third contact plugs CP1, CP2, CP3, and CP4 may be provided in the fifth upper dielectric layer 260. The fourth contact plug CP4 may penetrate not only the fifth upper dielectric layer 260, but also the fourth upper dielectric layer 250.

The bit-line contact plugs BCP and the first, second, third, and fourth contact plugs CP1, CP2, CP3, and CP4 may have their widths in the first direction D1 or the second direction D2 that increase in the third direction D3. The bit-line contact plugs BCP and the first, second, third, and fourth contact plugs CP1, CP2, CP3, and CP4 may include a conductive material, such as metal, metal nitride, metal silicide, and/or impurity-doped polysilicon.

Bit lines BL may be provided on corresponding bit-line contact plugs BCP, and first, second, third, and fourth conductive lines CL1, CL2, CL3, and CL4 may be respectively provided on the first, second, third, and fourth contact plugs CP1, CP2, CP3, and CP4. The bit lines BL may extend in the second direction D2 on the cell array region CAR. The bit lines BL may be connected through the bit-line contact plugs BCP to the first vertical structures VS1. The first, second, third, and fourth conductive lines CL1, CL2, CL3, and CL4 may be provided on the extension region EXR. The first, second, and third conductive lines CL1, CL2, and CL3 may be connected (e.g., electrically connected) to the peripheral circuit structure PS through the first, second, and third contacts C1, C2, and C3, respectively. For example, the second conductive lines CL2 may be connected through the second contacts C2 to corresponding pad portions ELp of the gate electrodes EL.

The fifth upper dielectric layer 260 may be on and, in some embodiments, cover the bit lines BL and the first, second, third, and fourth conductive lines CL1, CL2, CL3, and CL4. Although not shown, the fifth upper dielectric layer 260 may further be provided thereon with additional vias and additional lines that are respectively connected (e.g., electrically connected) to the bit lines BL and the first, second, third, and fourth conductive lines CL1, CL2, CL3, and CL4.

FIG. 7 illustrates an enlarged view of section A depicted in FIG. 6, partially showing a three-dimensional semiconductor memory device according to some embodiments of the present inventive concepts.

Referring to FIGS. 6 and 7, each of the second contacts C2 may include a first part C2a that penetrates the first and second upper dielectric layers 220 and 230, the planarized dielectric layer 210, and the interlayer dielectric layers 120, a second part C2b on the second upper dielectric layer 230, and a third part C2c that protrudes (e.g., in the first direction D1) from the first part C2a. In this description, the first and second parts C2a and C2b may be collectively called a vertical part, and the third part C2c may be called a protruding part. A single second contact C2 will be explained for convenience of description, but the following discussion may be applied substantially identically to other second contacts C2.

The first part C2a of the second contact C2 may be spaced apart in the first direction D1 from the gate electrodes EL. The third dielectric patterns 350 may be provided between the first part C2a and the gate electrodes EL. The third dielectric patterns 350 may each have a thickness greater than a second thickness T2 of each of the gate electrodes EL adjacent thereto. The thickness of the pad portion ELp of the gate electrode EL may be greater than a portion of the gate electrode EL between the pad portion ELp and the third dielectric pattern 350.

Each of the third dielectric patterns 350 may have a top surface 350t and a bottom surface 350b that are connected to the interlayer dielectric layers 120. A unitary structure may be constituted by each of the third dielectric patterns 350 and the interlayer dielectric layers 120 that are connected to the top and bottom surfaces 350t and 350b of the third dielectric pattern 350. Each of the third dielectric patterns 350 and the interlayer dielectric layers 120 above and below the third dielectric pattern 350 may constitute a unitary structure and may surround the gate electrodes EL.

Because the top and bottom surfaces 350t and 350b of each of the third dielectric patterns 350 are connected to the interlayer dielectric layers 120, it may be possible to prevent and/or reduce a collapse of the interlayer dielectric layers 120 in fabrication processes. The collapse may be reduced and/or prevented to allow a three-dimensional semiconductor memory device to have improved stability and/or electrical properties.

The barrier layer 330 may be interposed between the third dielectric patterns 350 and the gate electrodes EL. For example, the gate electrodes EL may be spaced apart in the first direction D1 from the third dielectric patterns 350 across the barrier layer 330. The barrier layer 330 may cover a sidewall ELs of each of the gate electrodes EL, and may extend in the first direction D1 along top and bottom surfaces of each of the gate electrodes EL. Each of the third dielectric patterns 350 may completely cover a sidewall of the barrier layer 330. The top and bottom surfaces 350t and 350b of each of the third dielectric patterns 350 may be substantially coplanar respectively with top and bottom surfaces of the barrier layer 330.

The second part C2b of the second contact C2 may be located at a level higher than that of a top surface of the second upper dielectric layer 230. The second part C2b may have a width in the first direction D1 greater than a width in the first direction D1 of the first part C2a.

The third part C2c of the second contact C2 may protrude from the first part C2a in the first direction D1 and an opposite direction opposite to the first direction D1. The third part C2c may be in direct contact with a sidewall ELps of the pad portion ELp included in each of the gate electrodes EL. For example, the second contact C2 may be electrically connected through the third part C2c to one of the gate electrodes EL. The barrier layer 330 may not be interposed between the third part C2c and the sidewall ELps of the pad portion ELp. The barrier layer 330 may extend in the first direction D1 along top and bottom surfaces of the pad portion ELp. The third part C2c may have a width C2cW in the first direction D1 less than a width 350W in the first direction D1 of each of the third dielectric patterns 350.

The gate electrode EL may have a first thickness T1 at its pad portion ELp in contact with the third part C2c, and the first thickness T1 may be greater than a second thickness T2 of another gate electrode EL. A difference between the first and second thicknesses T1 and T2 may be equal to or greater than about 10 nm, or from about 10 nm to about 20 nm.

Figure 8:
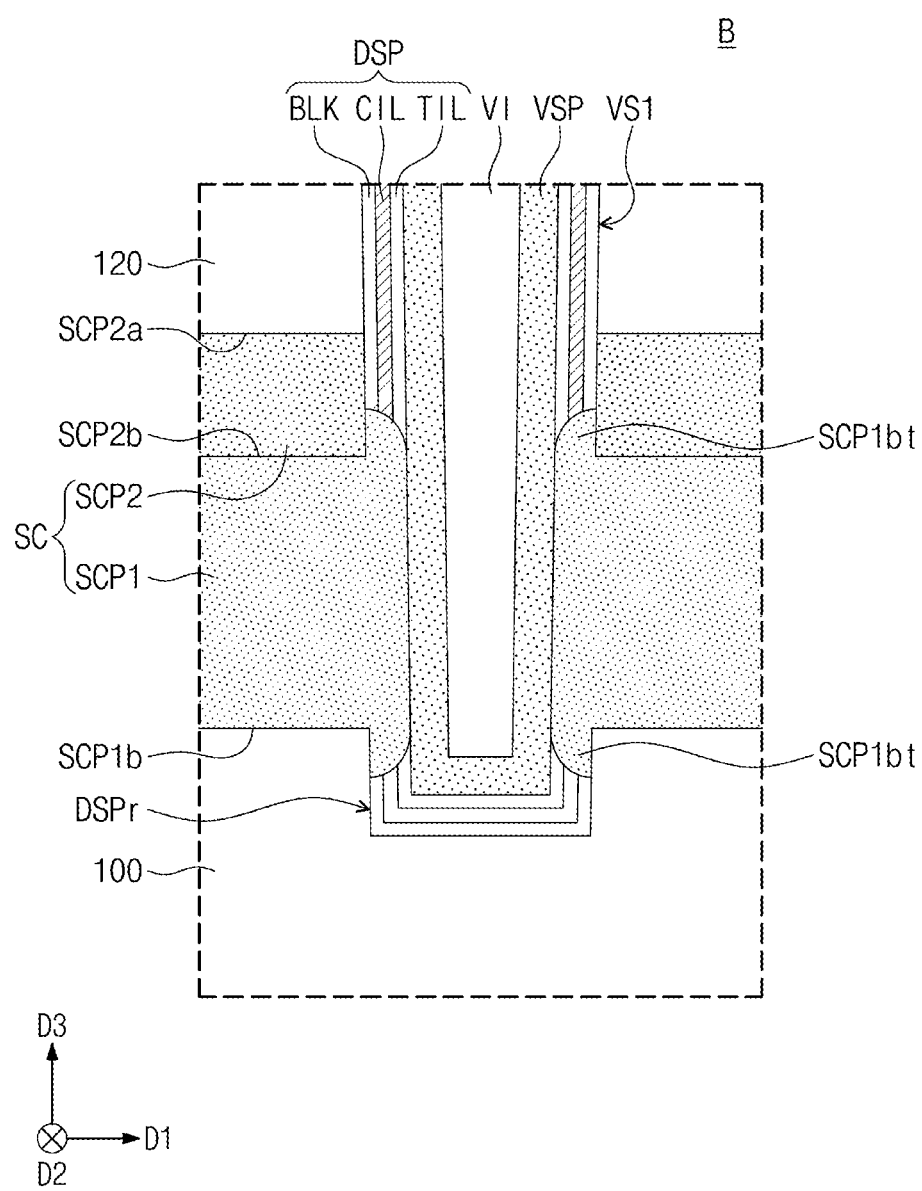

FIG. 8 illustrates an enlarged view of section B depicted in FIG. 6, partially showing a three-dimensional semiconductor memory device according to some embodiments of the present inventive concepts.

Referring to FIGS. 6 and 8, an illustration is provided of the source structure SC including first and second source conductive patterns SCP1 and SCP2 and an illustration is provided of one of the first vertical structures VS1 each including a data storage pattern DSP, a vertical semiconductor pattern VSP, a buried dielectric pattern VI, and a lower data storage pattern DSPr. A single stack structure ST and a single first vertical structure VS1 are explained for convenience of description, but the following discussion may be applicable to other first vertical structures VS1 that penetrate other stack structures ST.

The data storage pattern DSP may include a blocking dielectric layer BLK, a charge storage layer CIL, and a tunneling dielectric layer TIL that are sequentially stacked. The blocking dielectric layer BLK may be adjacent to the stack structure ST or the source structure SC, and the tunneling dielectric layer TIL may be adjacent to the vertical semiconductor pattern VSP. The charge storage layer CIL may be interposed between the blocking dielectric layer BLK and the tunneling dielectric layer TIL. The blocking dielectric layer BLK, the charge storage layer CIL, and the tunneling dielectric layer TIL may extend in the third direction D3 between the stack structure ST and the vertical semiconductor pattern VSP. The data storage pattern DSP may store and/or change data by using Fowler-Nordheim tunneling induced by a voltage difference between the vertical semiconductor pattern VSP and the gate electrodes EL. For example, the blocking dielectric layer BLK and the tunneling dielectric layer TIL may include silicon oxide, and the charge storage layer CIL may include silicon nitride or silicon oxynitride.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protruding parts SCP1*bt* located at a level higher than that of a bottom surface SCP2*b* of the second source conductive pattern SCP2 or lower than that of a bottom surface SCP1*b* of the first source conductive pattern SCP1. The protruding parts SCP1*bt* may be located at a level lower than that of a top surface SCP2*a* of the second source conductive pattern SCP2. The protruding parts SCP1*bt* may each have, for example, a curved shape at a surface in contact with the data storage pattern DSP or the lower data storage pattern DSPr.

Figure 9:
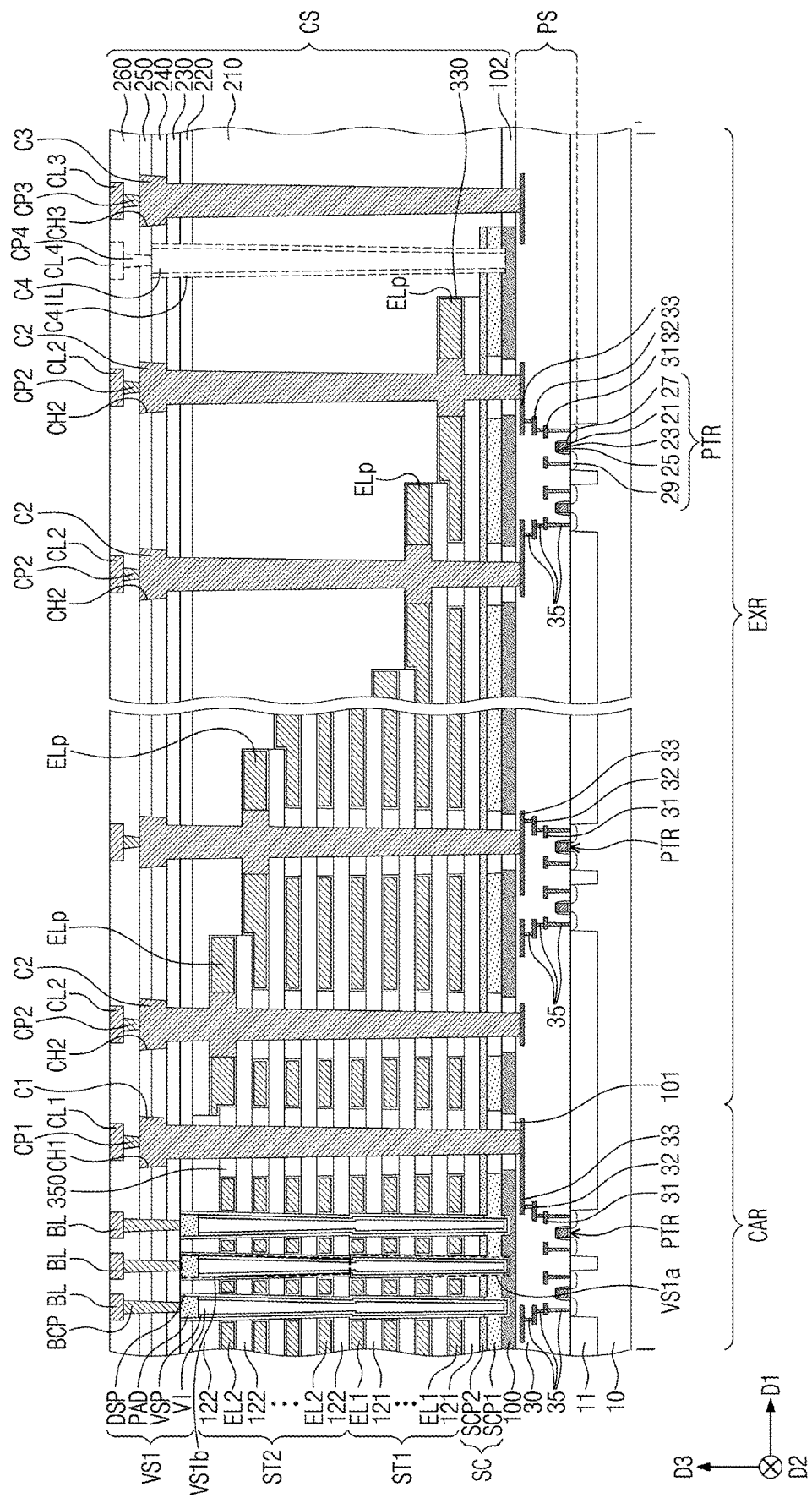
FIG. 9 illustrates a cross-sectional view taken along line I-I' of FIG. 5, showing a three-dimensional semiconductor memory device according to some embodiments of the present inventive concepts.

FIG. 9 illustrates a cross-sectional view taken along line I-I' of FIG. 5, showing a three-dimensional semiconductor memory device according to some embodiments of the present inventive concepts. The following will omit explanations substantially the same as those discussed with reference to FIG. 6.

Referring to FIGS. 5 and 9, the stack structure ST may include a first stack structure ST1 on the second substrate 100 and a second stack structure ST2 on the first stack structure ST1. The first stack structure ST1 may include first interlayer dielectric layers 121 and first gate electrodes EL1 that are alternately stacked, and the second stack structure ST2 may include second interlayer dielectric layers 122 and second gate electrodes EL2 that are alternately stacked.

Each of the first vertical structures VS1 that penetrate the stack structure ST may include a first part VS1*a* and a second part VS1*b*. The second vertical structures VS2 may be formed simultaneously with the first vertical structures VS1, and may have substantially the same structure as that of the first vertical structures VS1.

The first part VS1*a* of each of the first vertical structures VS1 may penetrate the first stack structure ST1, and the second part VS1*b* of each of the first vertical structures VS1 may penetrate the second stack structure ST2. The second part VS1*b* may be provided on and connected to the first part VS1*a*. A width at an uppermost segment of the first part VS1*a* may be greater than a width at a lowermost segment of the second part VS1*b*. For example, each of the first vertical structures VS1 may have a sidewall that has a step difference (e.g., having a stepped profile) at a boundary between the first part VS1*a* and the second part VS1*b*. However, this is merely an example, and a sidewall of each of the first vertical structures VS1 may have a step difference at one or more locations.

FIGS. 10 to 17 illustrate cross-sectional views taken along line I-I' of FIG. 5, showing a method of fabricating a three-dimensional semiconductor memory device according to some embodiments of the present inventive concepts. The following will discuss in detail three-dimensional semiconductor memory devices and methods of fabricating the same according to some embodiments of the present inventive concepts in conjunction with the accompanying drawings.

Figure 10:
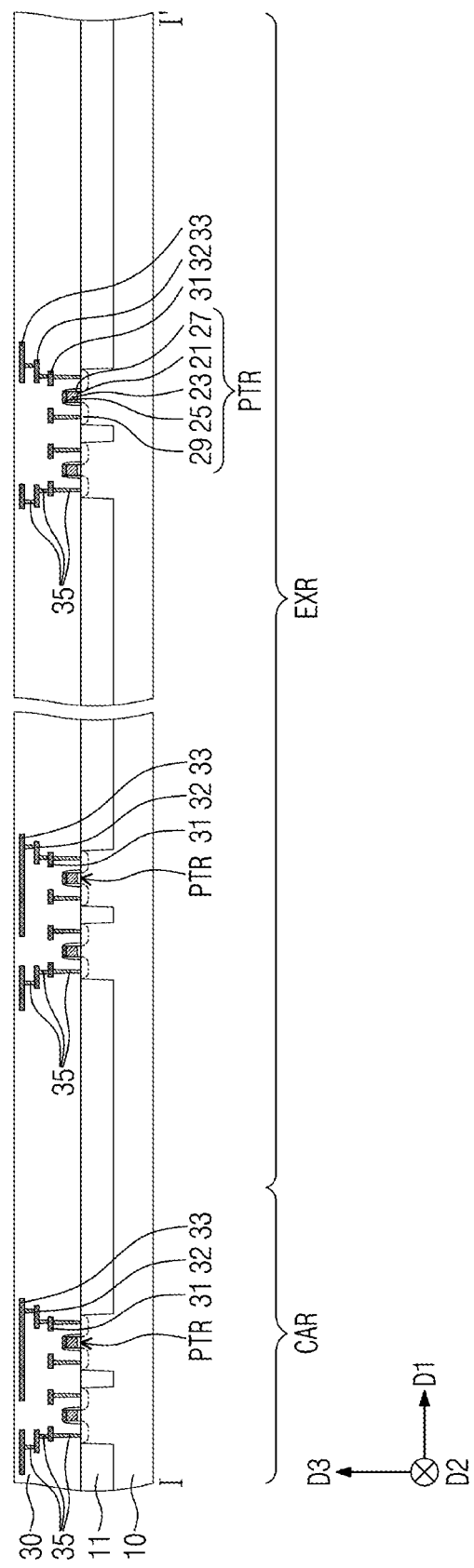
FIGS. 10 to 17 illustrate cross-sectional views taken along line I-I' of FIG. 5, showing a method of fabricating a three-dimensional semiconductor memory device according to some embodiments of the present inventive concepts.

Referring to FIG. 10, a first substrate 10 may be provided which includes a cell array region CAR and an extension region EXR. A device isolation layer 11 may be formed to define active sections in the first substrate 10. The device isolation layer 11 may be formed by forming a trench in an upper portion of the first substrate 10 and filling the trench with silicon oxide.

Peripheral transistors PTR may be formed on the active sections defined by the device isolation layer 11. First, second, and third peripheral circuit lines 31, 32, and 33 and peripheral contact plugs 35 may be formed to have an electrical connection with the peripheral transistors PTR. A peripheral circuit dielectric layer 30 may be formed to cover the peripheral transistors PTR, the first, second, and third peripheral circuit lines 31, 32, and 33, and the peripheral contact plugs 35.

Figure 11:
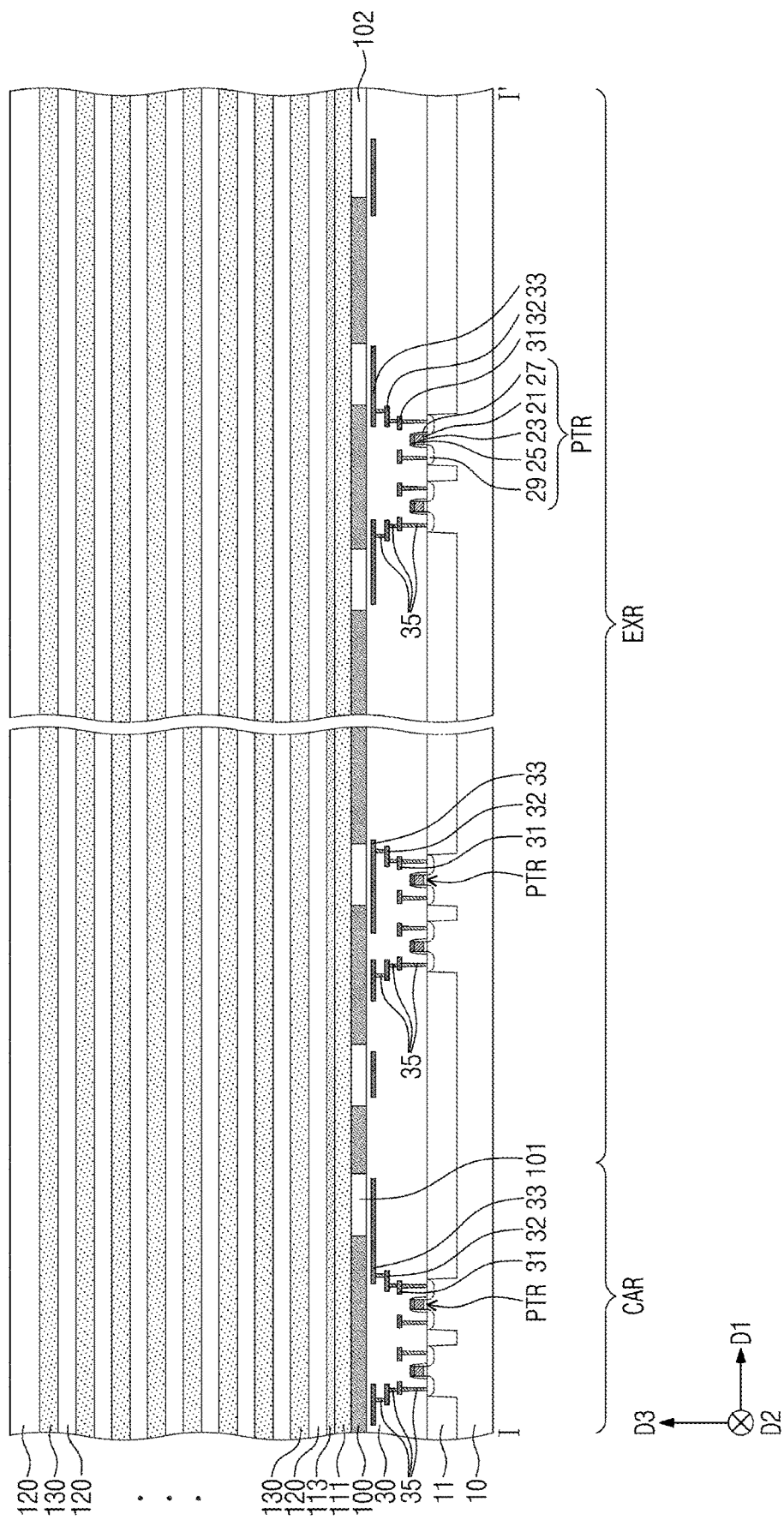

Referring to FIG. 11, a second substrate 100, first dielectric patterns 101, and a second dielectric pattern 102 may be formed on the peripheral circuit dielectric layer 30. The second substrate 100, the first dielectric patterns 101, and the second dielectric pattern 102 may be formed by forming a semiconductor layer on the peripheral circuit dielectric layer 30, patterning the semiconductor layer until a top surface of the peripheral circuit dielectric layer 30 is exposed, forming a dielectric layer on the peripheral circuit dielectric layer 30 and the semiconductor layer, and performing a planarization process on the dielectric layer until a top surface of the semiconductor layer is exposed. The planarization process may cause the first and second dielectric patterns 101 and 102 to have their top surfaces substantially coplanar with that of the second substrate 100. In this description below, the phrase "substantially coplanar with" may mean that a planarization process can be performed. The planarization process may include, for example, a chemical mechanical polishing (CMP) process or an etch-back process.

A lower sacrificial layer 111 and a lower semiconductor layer 113 may be formed on the second substrate 100, the first dielectric patterns 101, and the second dielectric pattern 102. On the lower semiconductor layer 113, a thin-layer structure may be formed to include interlayer dielectric layers 120 and sacrificial layers 130 that are alternately stacked. The sacrificial layers 130 may be formed of a material that can be etched with an etch selectivity with respect to the interlayer dielectric layers 120. For example, the sacrificial layers 130 may be formed of a dielectric material different from that of the interlayer dielectric layers 120. For example, the sacrificial layers 130 may be formed of silicon nitride, and the interlayer dielectric layers 120 may be formed of silicon oxide. The sacrificial layers 130 may have substantially the same thickness, and the interlayer dielectric layers 120 may have different thicknesses depending on their positions.

Figure 12:
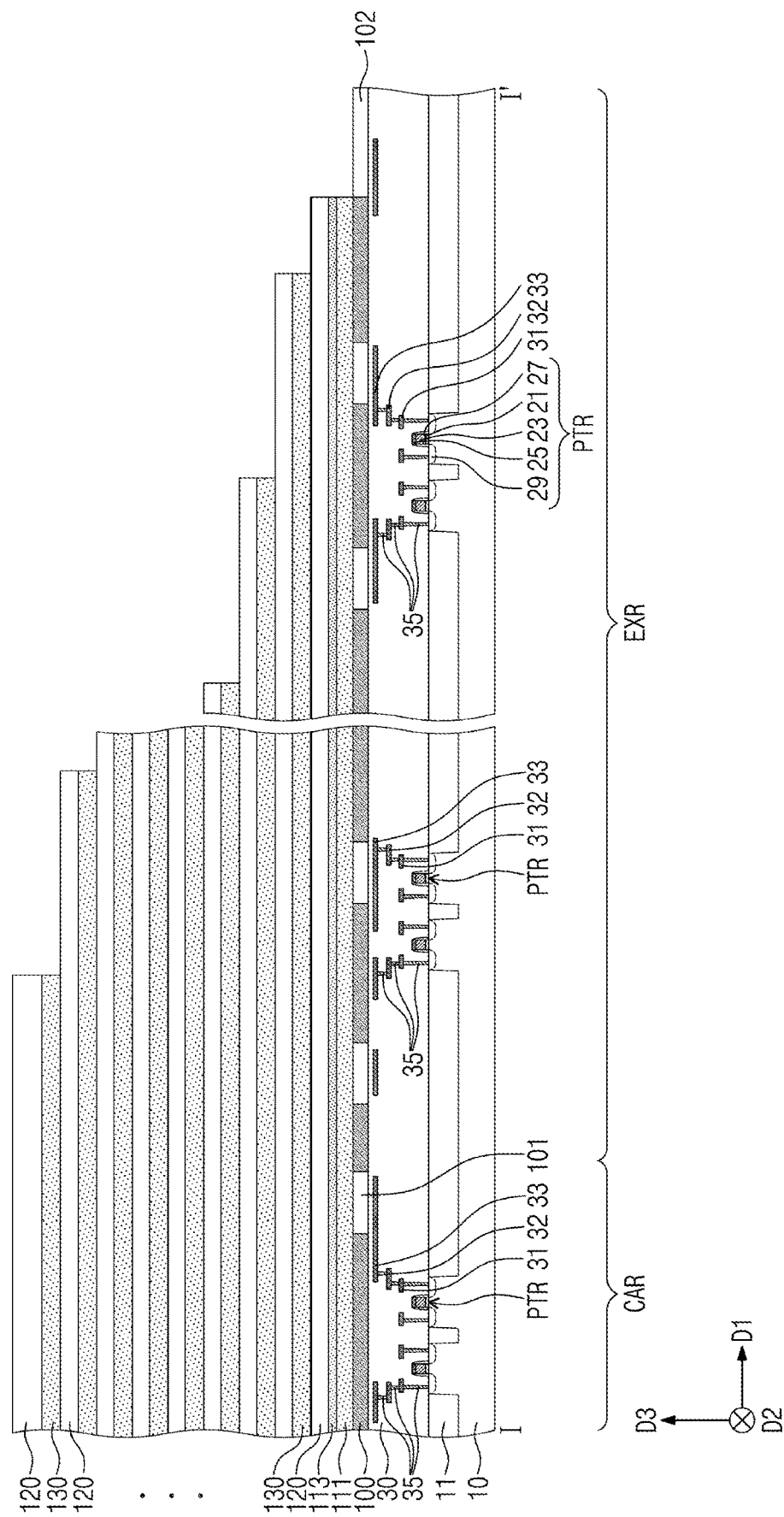

Referring to FIG. 12, a trimming process may be performed on the thin-layer structure including the interlayer dielectric layers 120 and the sacrificial layers 130 that are alternately stacked. The trimming process may include forming a mask pattern that partially covers the thin-layer structure on the cell array region CAR and the extension region EXR, using the mask pattern to pattern the thin-layer structure, reducing an area of the mask pattern, and using the reduced mask pattern to pattern the thin-layer structure. The reducing the area of the mask pattern and the using the reduced mask pattern to pattern the thin-layer structure may be repeatedly and alternately performed.

The trimming process may externally expose at least a portion of each of the interlayer dielectric layers 120, and may allow the thin-layer structure to have a stepwise structure formed on the extension region EXR.

Figure 13:
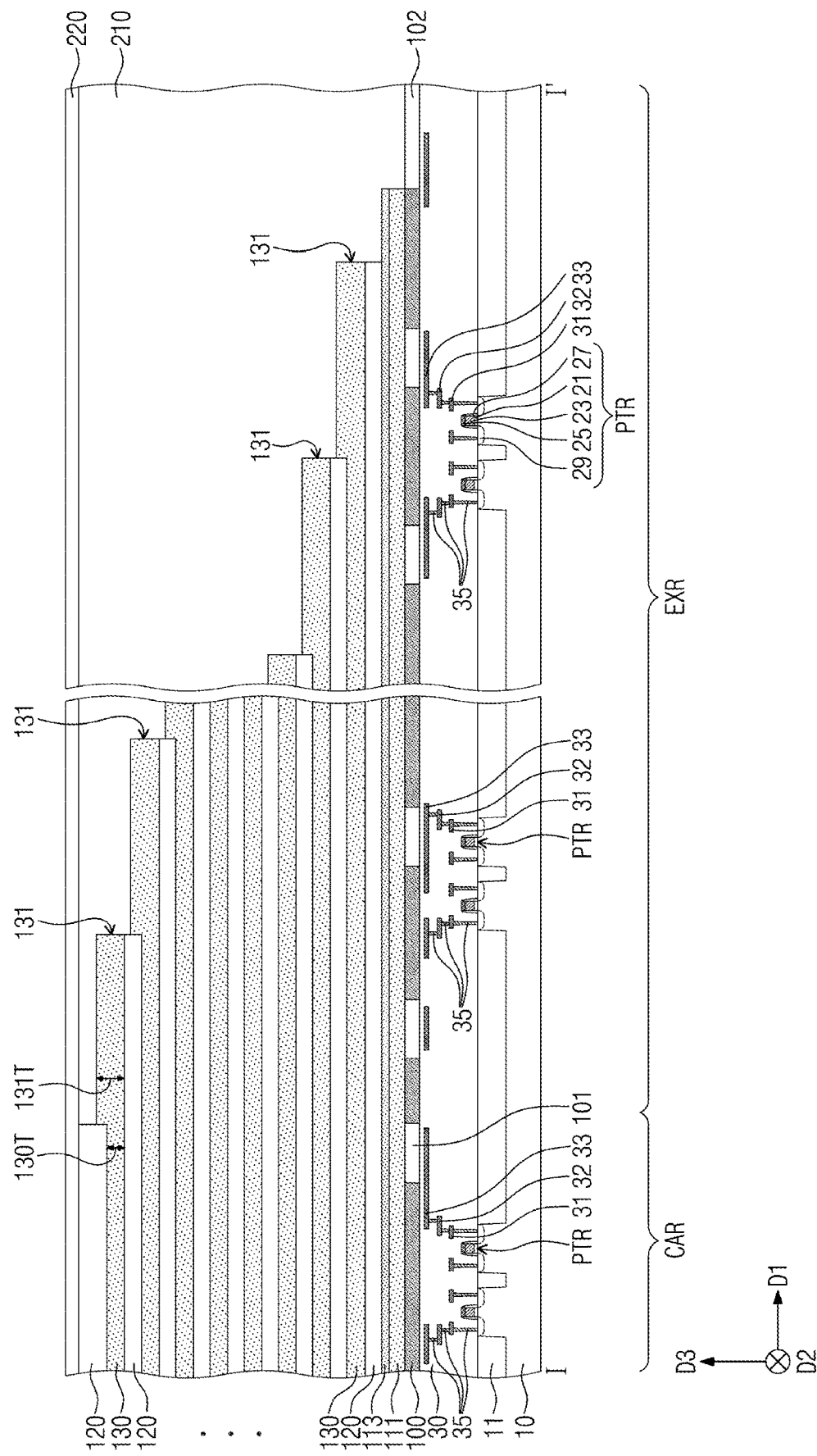

Referring to FIG. 13, a pad layer 131 may be formed to have a thickness greater than that of other portions of each of the sacrificial layers 130. The pad layer 131 may be a portion of the sacrificial layer 130, and may be formed at an end of the sacrificial layer 130. The pad layer 131 may be formed by partially removing the interlayer dielectric layers 120 externally exposed at the stepwise structure, additionally deposing the same material as that of the sacrificial layers 130, and performing an etching process to allow the additional deposited material to remain only on the interlayer dielectric layers 120.

The pad layer 131 may have a thickness 131T greater than a thickness 130T of another portion of the sacrificial layer 130 connected to the pad layer 131. The pad layer 131 may have a top surface at a higher level than that of a top surface of the other portion of the sacrificial layer 130.

A planarized dielectric layer 210 may be formed to cover the pad layer 131, the lower semiconductor layer 113, and the second dielectric pattern 102. The planarized dielectric layer 210 may have a top surface substantially coplanar with that of an uppermost one of the interlayer dielectric layers 120. The planarized dielectric layer 210 may be formed of a material that can be etched with an etch selectivity with respect to the sacrificial layers 130.

Afterwards, a first upper dielectric layer 220 may be formed to cover the planarized dielectric layer 210 and the uppermost one of the interlayer dielectric layers 120.

Figure 14:
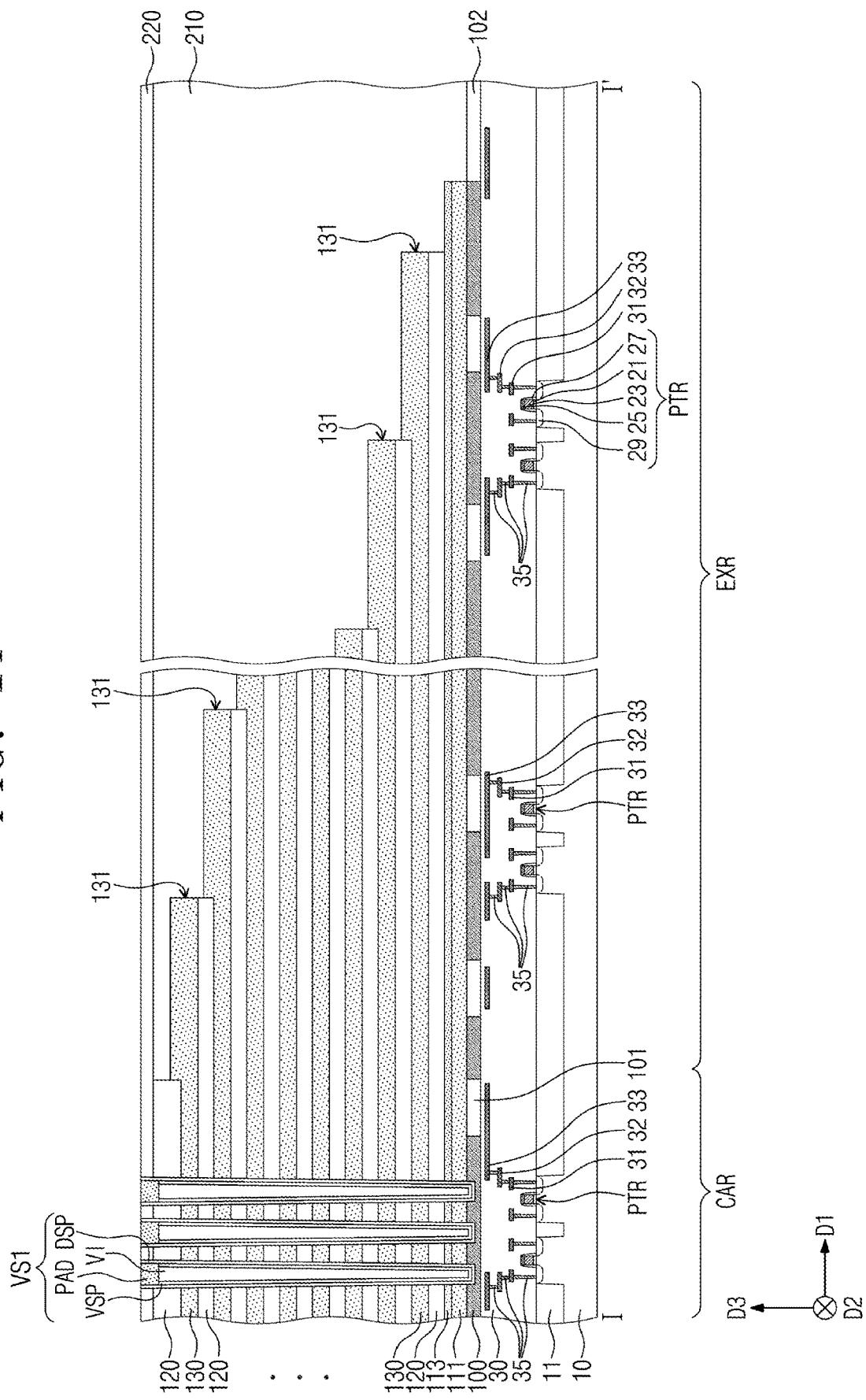

Referring to FIG. 14, on the cell array region CAR, first vertical structures VS1 may be formed to penetrate the first upper dielectric layer 220, the interlayer dielectric layers 120 and the sacrificial layers 130 that are alternately stacked, the lower semiconductor layer 113, the lower sacrificial layer 111, and at least a portion of the second substrate 100. Although not shown, on the extension region EXR, second vertical structures VS2 may be formed to penetrate the first upper dielectric layer 220, the interlayer dielectric layers 120 and the sacrificial layers 130 that are alternately stacked, the lower semiconductor layer 113, the lower sacrificial layer 111, and at least a portion of the second substrate 100. The second vertical structures VS2 may be formed simultaneously with the first vertical structures VS1. The following description of the first vertical structures VS1 may be applied substantially identically to the second vertical structures VS2. Alternatively, the second vertical structures VS2 may not be formed in accordance with embodiments.

Each of the first vertical structures VS1 may be formed by etching the stack structure ST to form a hole whose aspect ratio is high, forming a data storage pattern DSP and a vertical semiconductor pattern VSP that conformally cover a sidewall of the hole, forming a buried dielectric pattern VI in a space surrounded by the vertical semiconductor pattern VSP, and forming a conductive pad PAD in a space surrounded by the buried dielectric pattern VI and the data storage pattern DSP. The first vertical structures VS1 may have their top surfaces substantially coplanar with that of the first upper dielectric layer 220.

Figure 15:
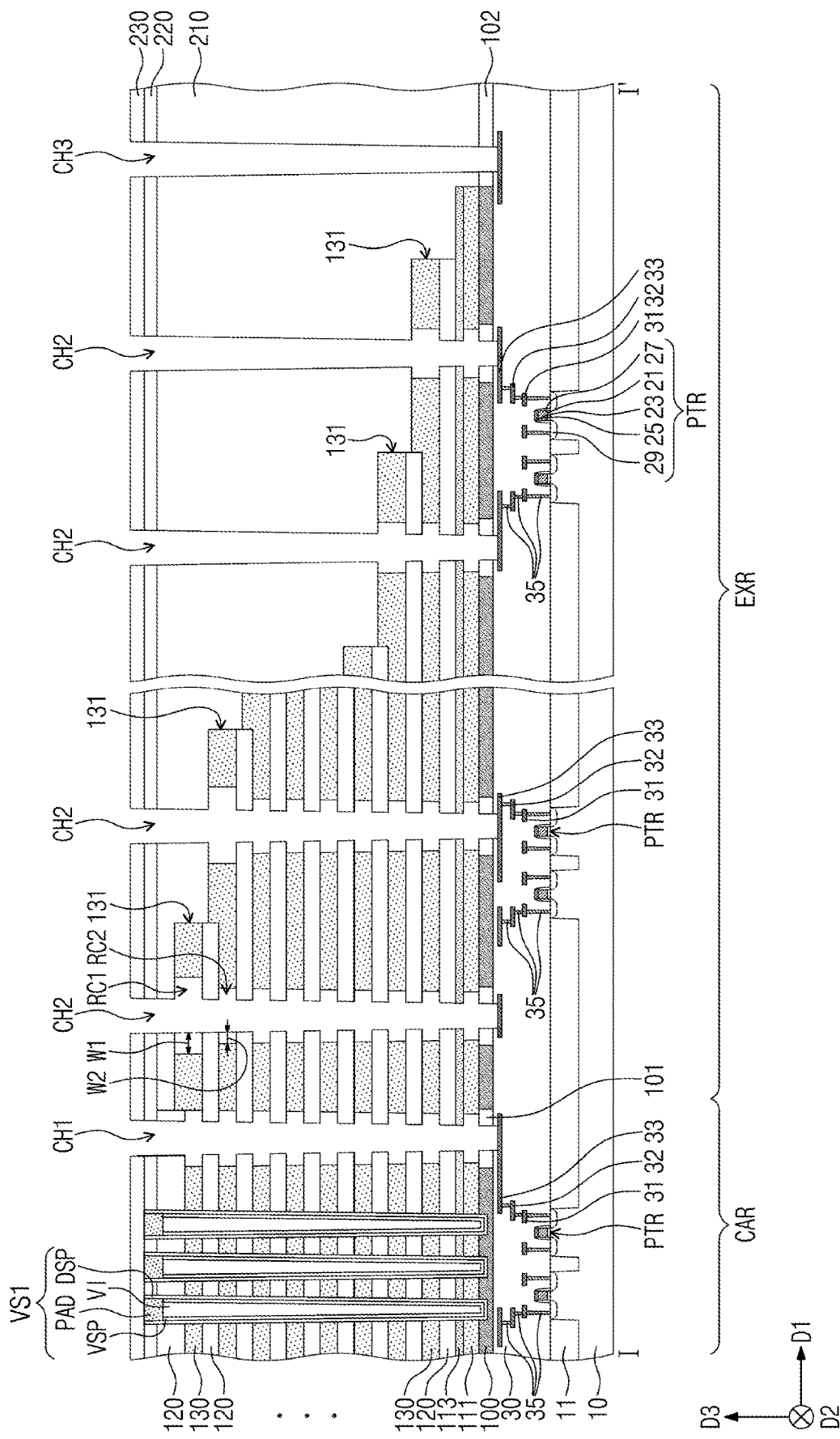

Referring to FIG. 15, a second upper dielectric layer 230 may be formed on the first upper dielectric layer 220 and the first vertical structures VS1.

Thereafter, a first channel hole CH1 may be formed to penetrate the first and second upper dielectric layers 220 and 230 and the stack structure ST. In addition, second channel holes CH2 may be formed to penetrate the first and second upper dielectric layers 220 and 230, the planarized dielectric layer 210, and the stack structure ST. The second channel holes CH2 may penetrate corresponding pad layers 131 of the sacrificial layers 130. Moreover, a third channel hole CH3 may be formed to penetrate the first and second upper dielectric layers 220 and 230, the planarized dielectric layer 210, and the second dielectric pattern 102. The first, second, and third channel holes CH1, CH2, and CH3 may have substantially the same width at their uppermost portions. For example, the width at the uppermost portion of each of the first, second, and third channel holes CH1, CH2, and CH3 may become larger in a case where the second vertical structures VS2 are not formed than in a case where the second vertical structures VS2 are formed.

The sacrificial layers 130 exposed to the first and second channel holes CH1 and CH2 may be partially removed. The sacrificial layers 130 exposed to the second channel holes CH2 may be partially removed to form a first recession RC1 and a second recession RC2. The first recession RC1 may be defined as a space from which is removed the pad layer 131 of each of the sacrificial layers 130, and the second recession RC2 may be defined as a space from which is removed a portion, other than the pad layer 131, of each of the sacrificial layers 130.

The pad layer 131 whose thickness is greater than that of other portions of each of the sacrificial layers 130 may be removed at a higher rate than those of other portions of the sacrificial layers 130. In this sense, the first recession RC1 may have a width W1 greater than a width W2 of the second recession RC2. The widths W1 and W2 of the first and second recessions RC1 and RC2 may each be defined to refer to a distance in a first direction D1 between a sidewall of the second channel hole CH2 before the sacrificial layers 130 is partially removed and the sacrificial layer 130 after the sacrificial layers 130 is partially removed.

Figure 16:
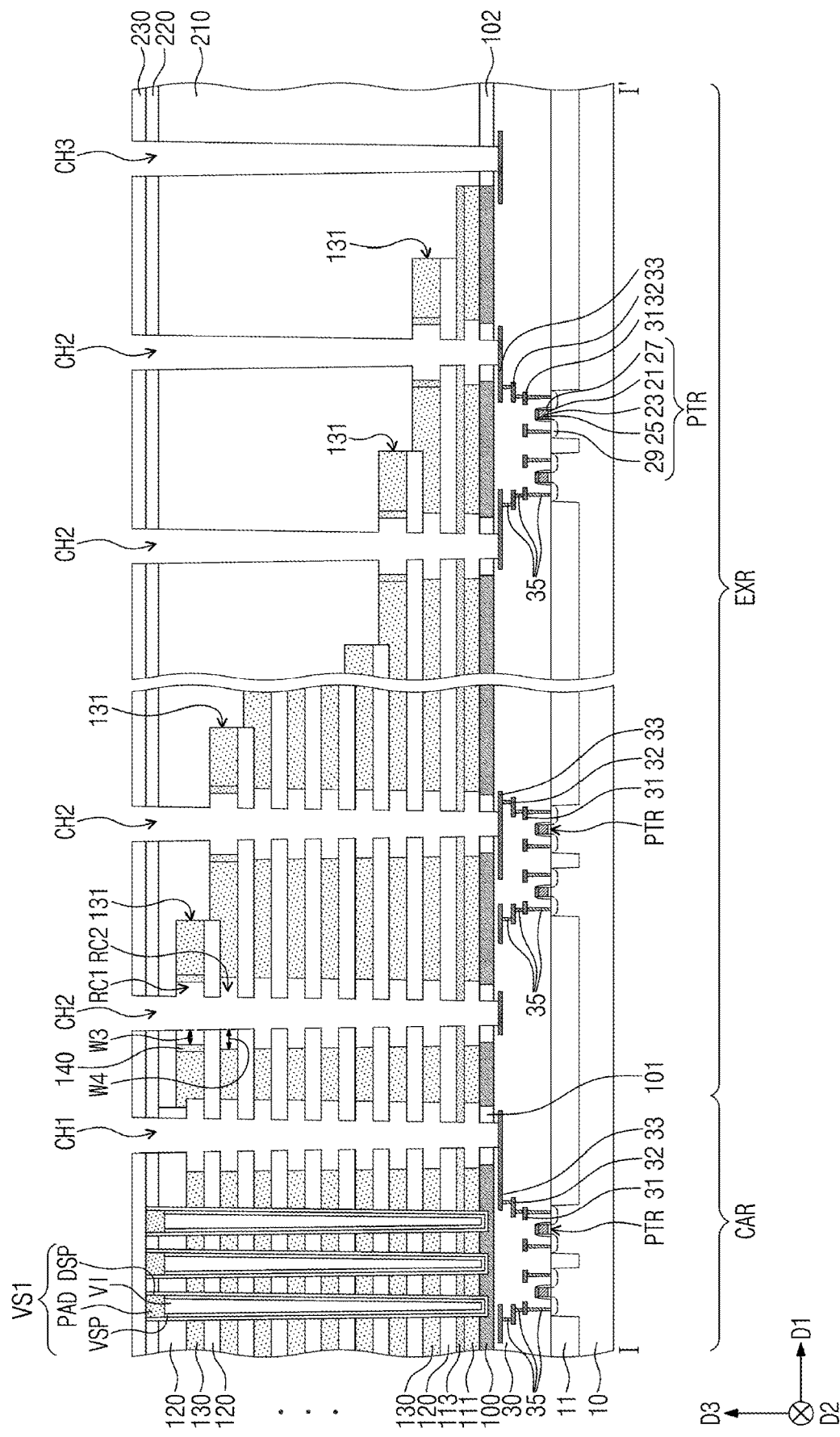

Referring to FIG. 16, an additional sacrificial layer 140 may be formed in the first recession RC1. The additional sacrificial layer 140 may be formed by forming an additional dielectric layer that is within and, in some embodiments, fills the first and second recessions RC1 and RC2, and partially removing the additional dielectric layer and the sacrificial layers 130. The additional dielectric layer may be formed of the same dielectric material (e.g., silicon nitride) as that of the sacrificial layers 130. The additional dielectric layer may be formed of a dielectric layer whose etch rate is less than that of the sacrificial layers 130.

The additional sacrificial layer 140 may remain only in the first recession RC1, and may be connected to the pad layer 131 of each of the sacrificial layers 130. During a process to remove the additional dielectric layer that fills the second recession RC2, the additional dielectric layer may be completely removed from the second recession RC2, and the sacrificial layers 130 may also be partially removed. After the formation of the additional sacrificial layer 140, the first recession RC1 may have a width W3 less than a width W4 of the second recession RC2.

Figure 17:
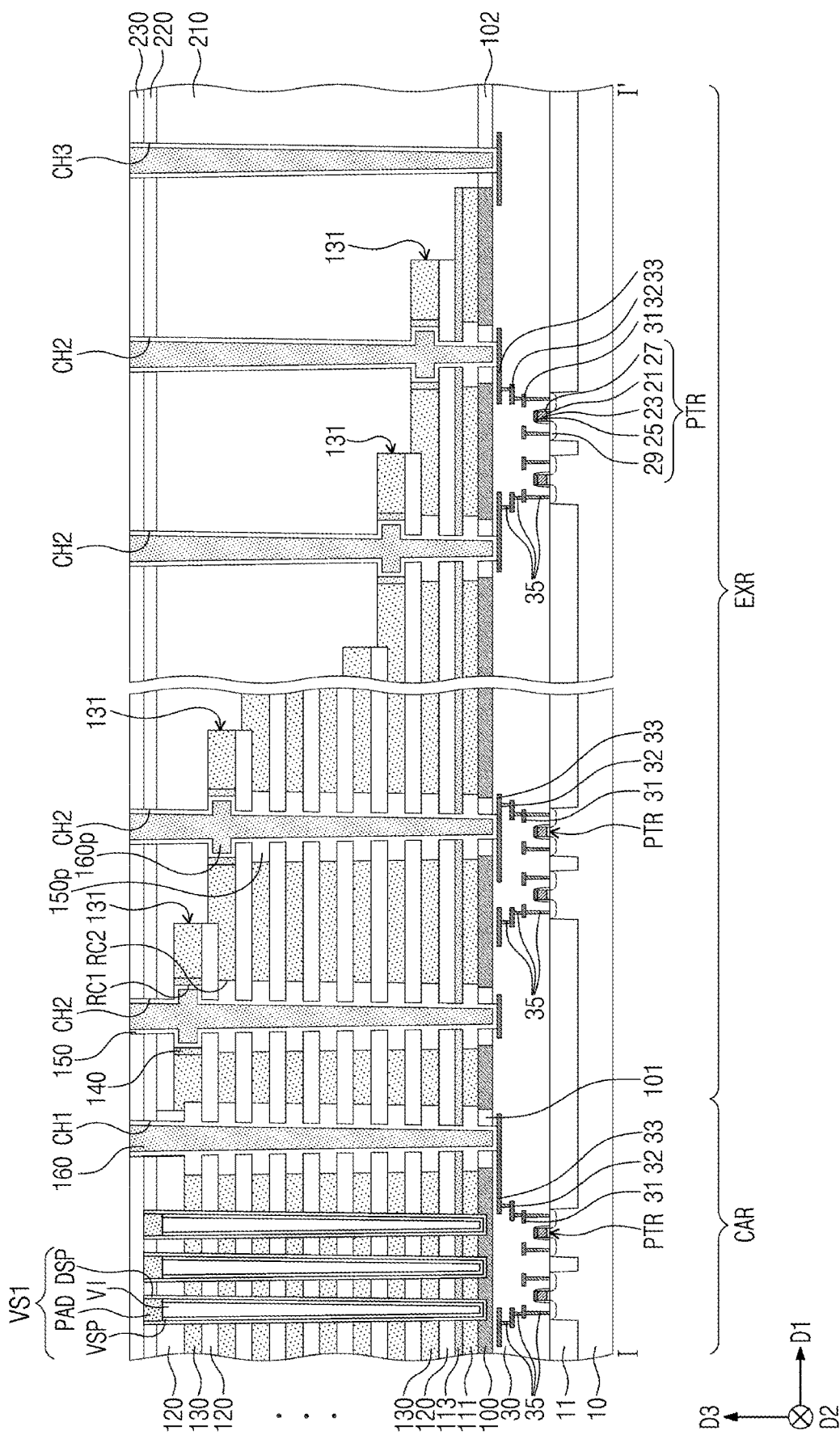

Referring to FIG. 17, a first spacer layer 150 may be formed to conformally cover a sidewall of each of the first, second, and third channel holes CH1, CH2, and CH3, and a gap-fill sacrificial layer 160 may be formed to fill an internal space surrounded by the first spacer layer 150 in each of the first, second, and third channel holes CH1, CH2, and CH3.

The first spacer layer 150 may fill the second recession RC2. A protruding part 150p of the first spacer layer 150 that fills the second recession RC2 may be connected to the interlayer dielectric layers 120.

The first spacer layer 150 may conformally cover an inside of the first recession RC1 and may contact the additional sacrificial layer 140. A protruding part 160p of the gap-fill sacrificial layer 160 may fill an inside surrounded by the first spacer layer 150 in the first recession RC1. For example, the first spacer layer 150 may be formed of silicon oxide, and the gap-fill sacrificial layer 160 may be formed of polysilicon.

Figure 18:
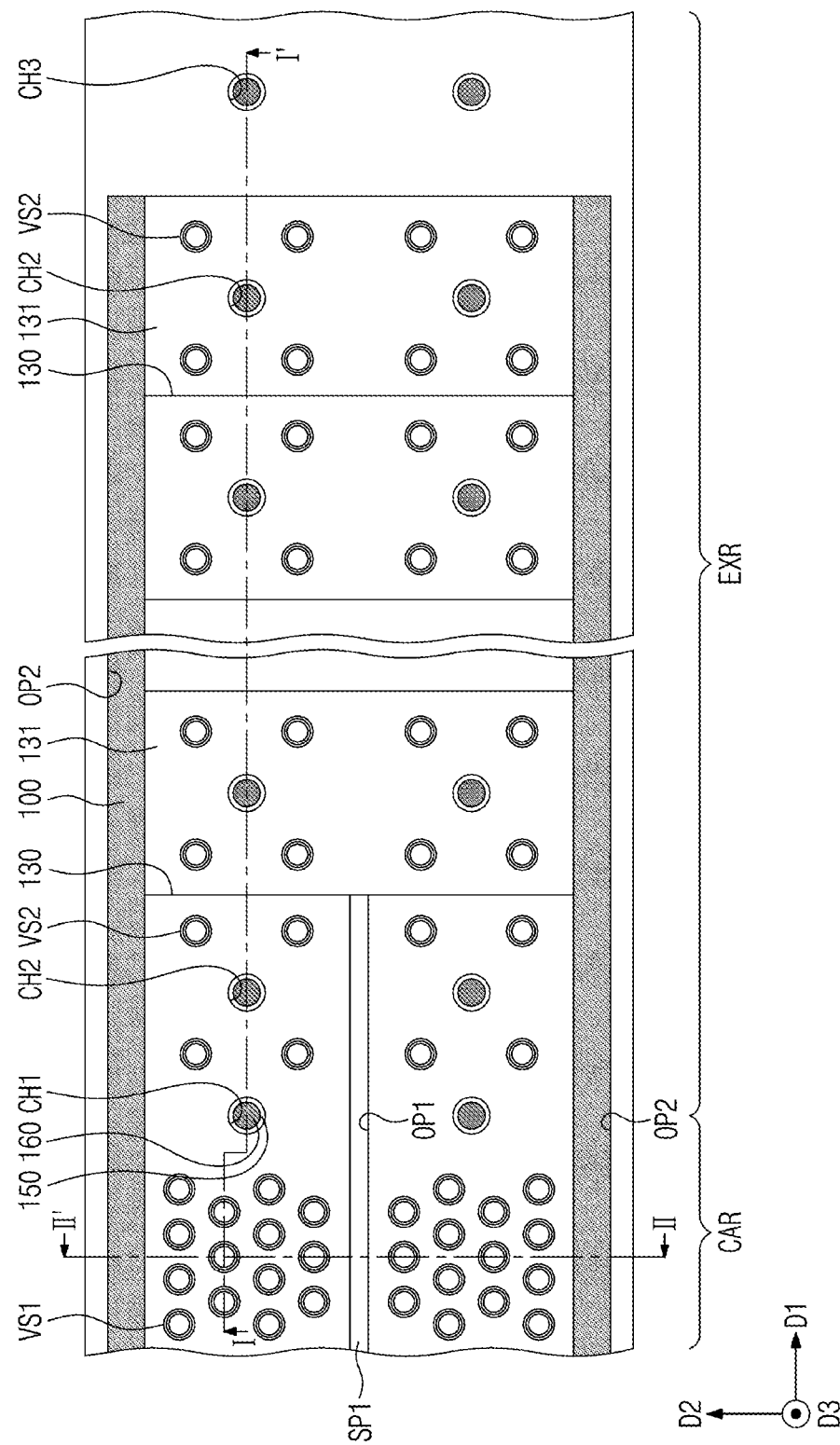
FIG. 18 illustrates a plan view showing a method of fabricating a three-dimensional semiconductor memory device according to some embodiments of the present inventive concepts.

FIG. 18 illustrates a plan view showing a method of fabricating a three-dimensional semiconductor memory device according to some embodiments of the present inventive concepts. FIGS. 19 to 22 illustrate cross-sectional views taken along line II-II' of FIG. 18, showing a method of fabricating a three-dimensional semiconductor memory device according to some embodiments of the present inventive concepts. FIG. 23 illustrates a cross-sectional view taken along line I-I' of FIG. 18, showing a method of fabricating a three-dimensional semiconductor memory device according to some embodiments of the present inventive concepts.

Figure 19:
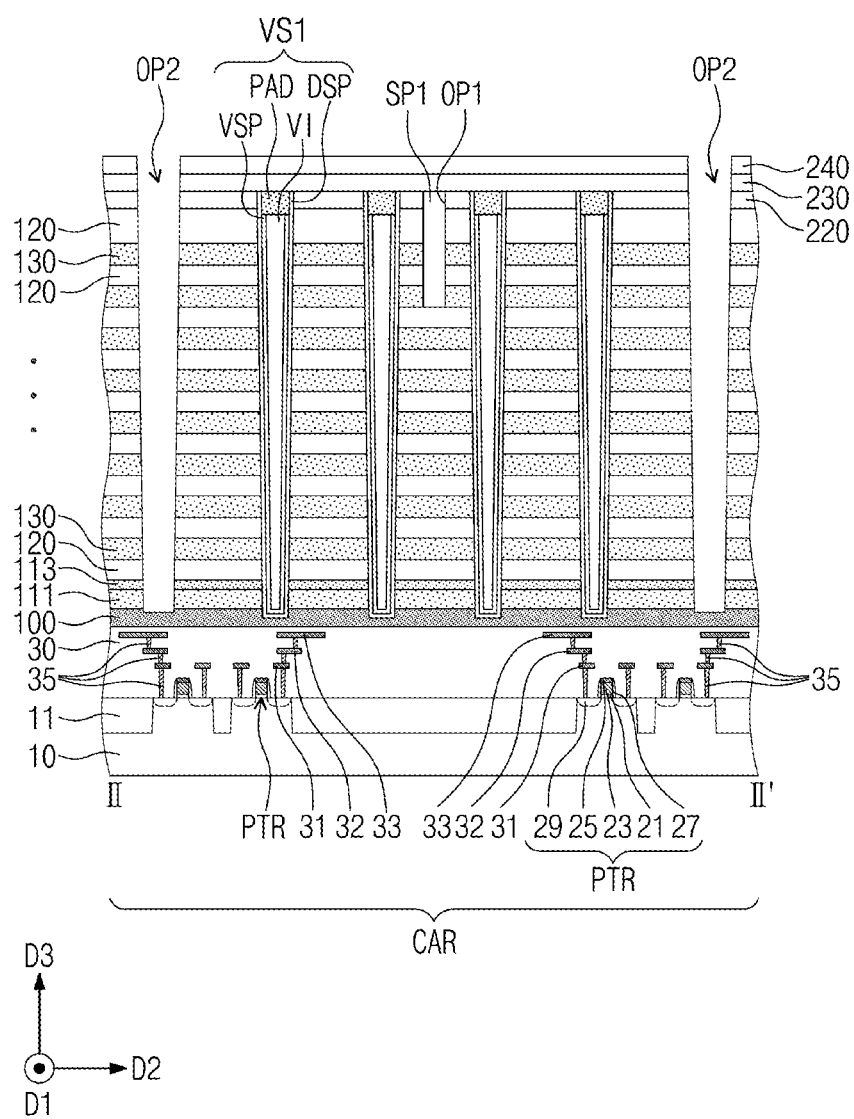
FIGS. 19 to 22 illustrate cross-sectional views taken along line II-II' of FIG. 18, showing a method of fabricating a three-dimensional semiconductor memory device according to some embodiments of the present inventive concepts.

Referring to FIGS. 18 and 19, a third upper dielectric layer 240 may be formed on the second upper dielectric layer 230.

Afterwards, a second opening OP2 may be formed to penetrate the stepwise structure and to extend in the first direction D1. The second opening OP2 may expose sidewalls of the interlayer dielectric layers 120, sidewall of the sacrificial layers 130, and a portion of the top surface of the second substrate 100.

Although not discussed with reference to FIGS. 10 to 17, a first separation pattern SP1 may be formed immediately before or after the formation of the first vertical structures VS1. The first separation pattern SP1 may be formed by forming a first opening OP1 that penetrates the first upper dielectric layer 220, portions of the interlayer dielectric layers 120, and portions of the sacrificial layers 130, and then filling the first opening OP1 with silicon oxide. The first separation pattern SP1 may have a top surface substantially coplanar with that of the first upper dielectric layer 220 and those of the first vertical structures VS1. The first opening OP1 may have a depth less than that of the second opening OP2. The first separation pattern SP1 may extend in the first direction D1 from the cell array region CAR toward the extension region EXR.

Figure 20:
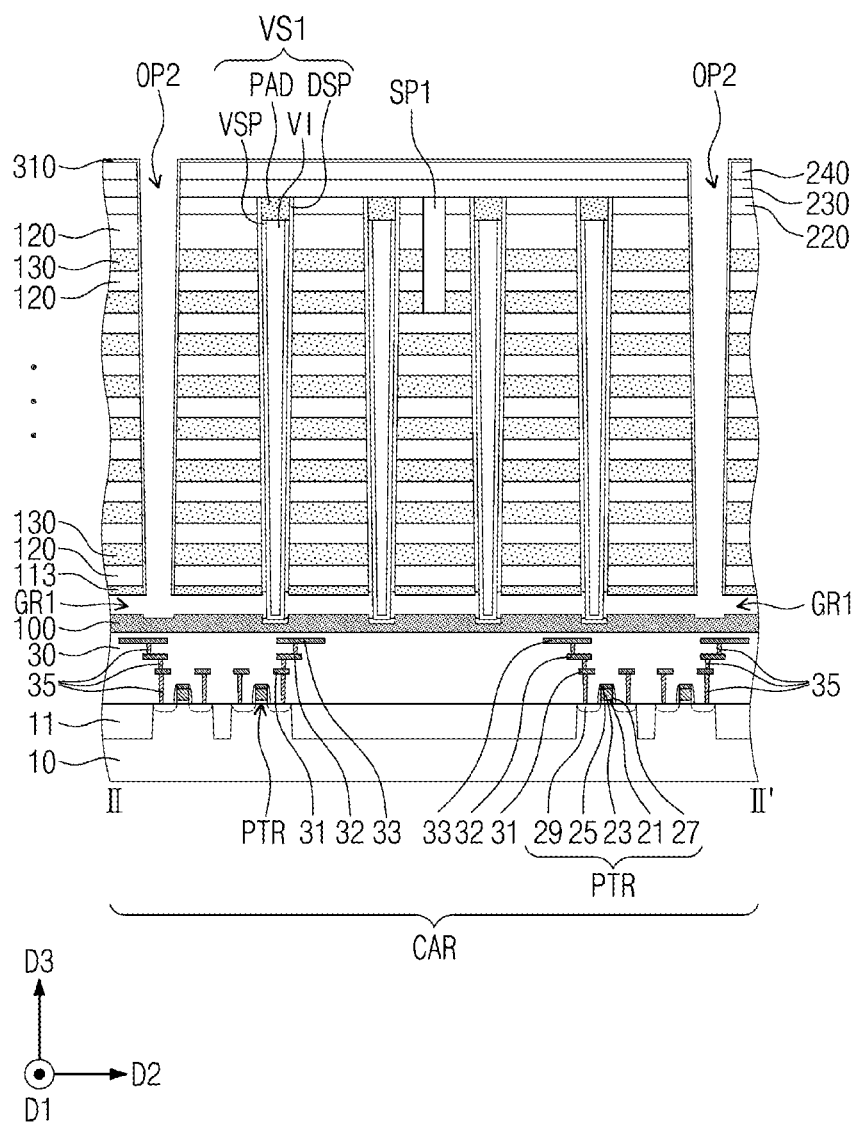

Referring to FIGS. 19 and 20, a second spacer layer 310 may be formed to conformally cover sidewalls of the first, second, and third upper dielectric layers 220, 230, and 240, sidewalls of the interlayer dielectric layers 120, and sidewalls of the sacrificial layers 130, which sidewalls of the layers 120, 130, 220, 230, and 240 are exposed to the second openings OP2. The second spacer layer 310 may cover a sidewall of the lower semiconductor layer 113, but may not cover a sidewall of the lower sacrificial layer 111. The second spacer layer 310 may be formed by forming a spacer material that conformally covers an inside of the second opening OP2 and removing the spacer material formed on a bottom surface of the second opening OP2. The second spacer layer 310 may be formed of, for example, impurity-undoped amorphous silicon or impurity-undoped polysilicon.

After that, the lower sacrificial layer 111 not covered with the second spacer layer 310 may be removed. The removal of the lower sacrificial layer 111 may include performing, for example, a wet etching process that uses hydrofluoric acid (HF) and/or phosphoric acid ($H_3PO_4$). As the lower sacrificial layer 111 is removed, the second opening OP2 may extend downwards. During the removal of the lower sacrificial layer 111, the second spacer layer 310 may prevent removal of the interlayer dielectric layers 120 and the sacrificial layers 130.

A spacer from which the lower sacrificial layer 111 is removed may be defined as a first gap region GR1. The first gap region GR1 may expose the top surface of the second substrate 100 and a bottom surface of the lower semiconductor layer 113. The first gap region GR1 may extend to a sidewall of the vertical semiconductor pattern VSP of each of the first vertical structures VS1. For example, the removal of the lower sacrificial layer 111 may partially remove the data storage pattern DSP of each of the first vertical structures VS1, and may expose the sidewall of the vertical semiconductor pattern VSP of each of the first vertical structures VS1.

Figure 21:
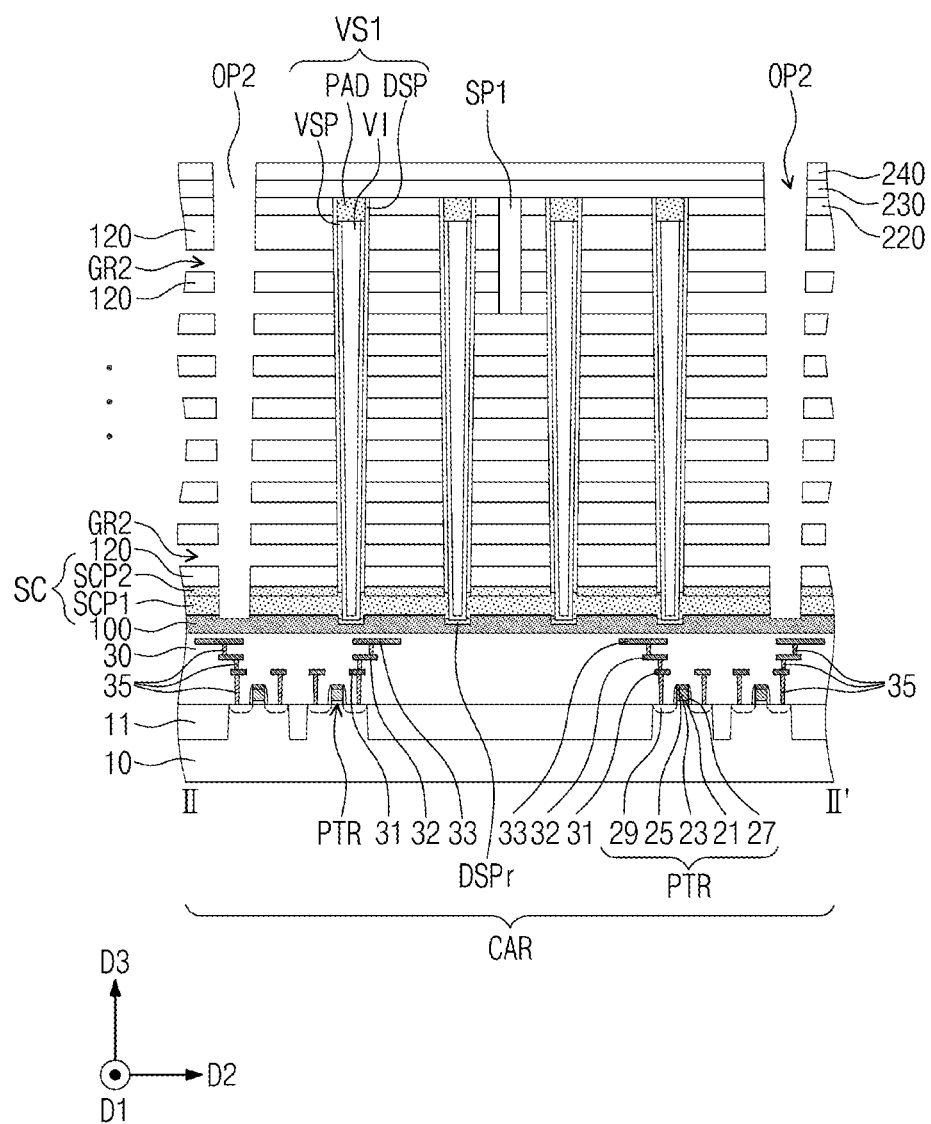

Referring to FIGS. 20 and 21, a first source conductive pattern SCP1 may be formed to fill the first gap region GR1. The first source conductive pattern SCP1 may be formed of, for example, an impurity-doped semiconductor material. Although not shown, an air gap may be formed in the first source conductive pattern SCP1.

The lower semiconductor layer 113 may be called a second source conductive pattern SCP2, and as a result, a source structure SC may be formed to include the first and second source conductive patterns SCP1 and SCP2. After the formation of the source structure SC, the second spacer layer 310 may be removed.

After that, the sacrificial layers 130 exposed to the second opening OP2 may be removed. The removal of the sacrificial layers 130 may include performing, for example, a wet etching process that uses hydrofluoric acid (HF) and/or phosphoric acid ($H_3PO_4$).

Referring back to FIG. 17, the removal of the sacrificial layers 130 may induce removal of the additional sacrificial layer 140 including the same dielectric material as that of the sacrificial layers 130. In contrast, there may be no removal of the first spacer layer 150 including a different dielectric material from that of the sacrificial layers 130. When the sacrificial layers 130 are removed, the first spacer layer 150 connected to the interlayer dielectric layers 120 may not be removed and thus the interlayer dielectric layers 120 may be reduced or prevented from being collapsed, with the result that a three-dimensional semiconductor memory device may increase in stability and electrical characteristics.

Spaces from which the sacrificial layers 130 are removed may be defined as second gap regions GR2. The second gap regions GR2 may expose top and/or bottom surfaces of each of the interlayer dielectric layers 120, and may partially expose a sidewall of the data storage pattern DSP of each of the first vertical structures VS1.

Figure 22:
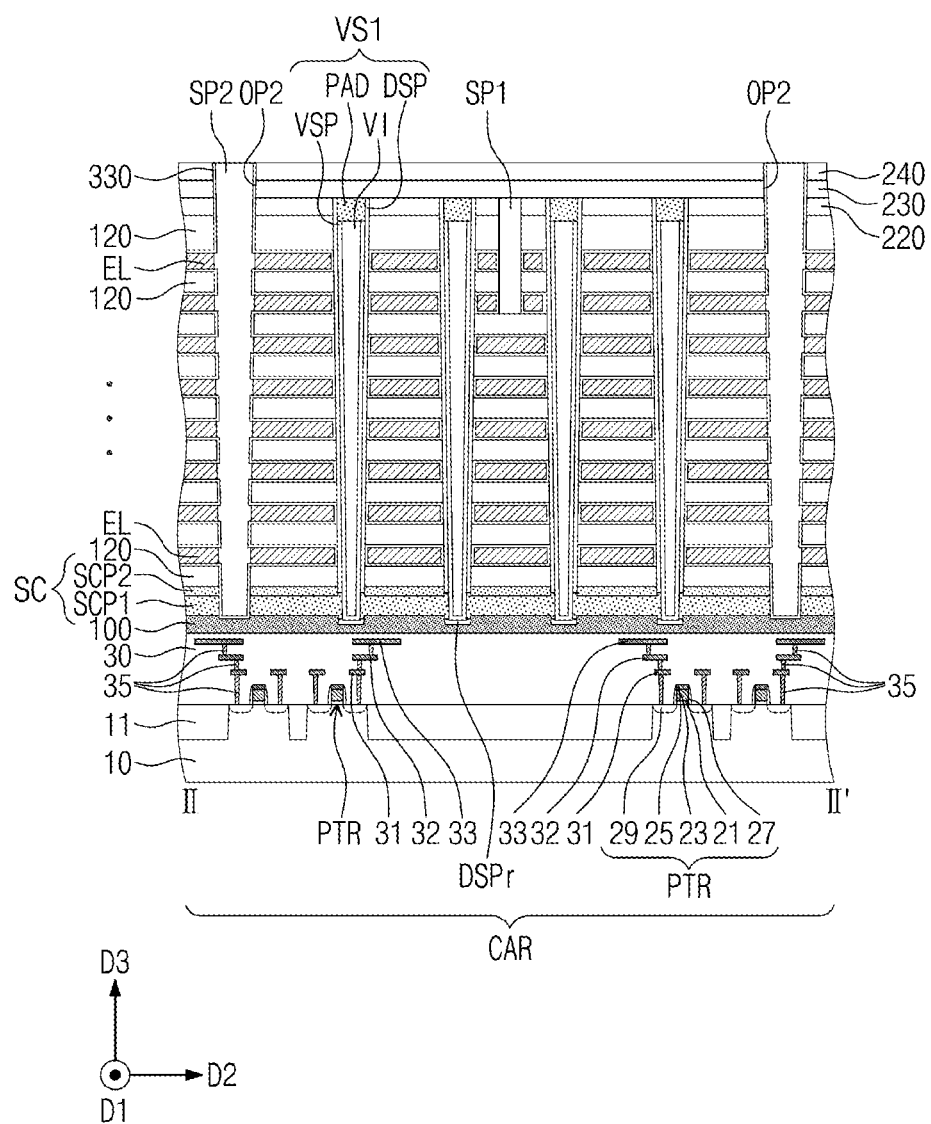
Figure 23:
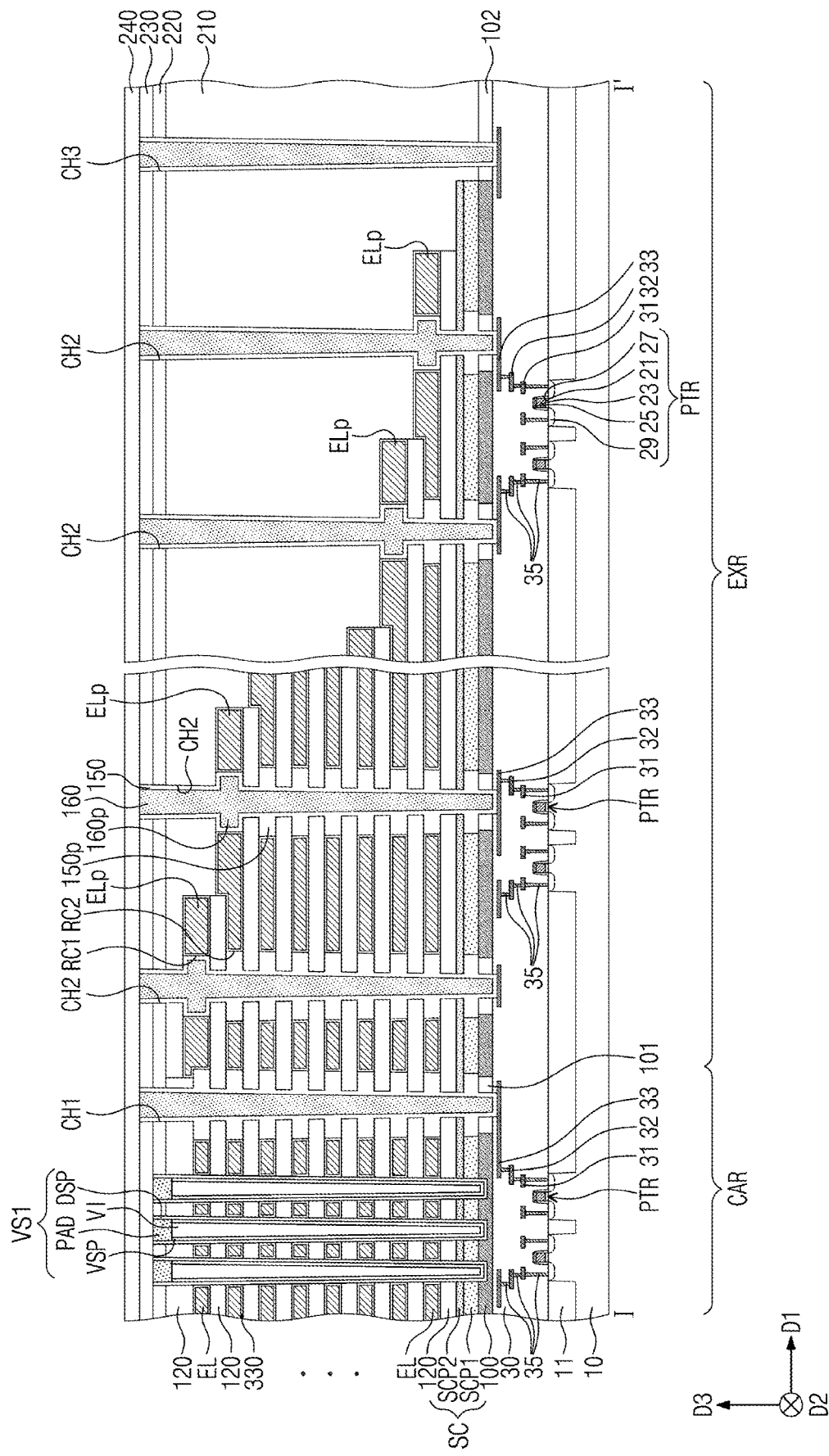
FIG. 23 illustrates a cross-sectional view taken along line I-I' of FIG. 18, showing a method of fabricating a three-dimensional semiconductor memory device according to some embodiments of the present inventive concepts.

Referring to FIGS. 21 to 23, a barrier layer 330 may be formed to cover the top and/or bottom surfaces of each of the interlayer dielectric layers 120 exposed to the second gap regions GR2, the sidewall of the first spacer layer 150 exposed to the second gap regions GR2, and the portion of the sidewall of the data storage pattern DSP of each of the first vertical structures VS1 exposed to the second gap regions GR2. The barrier layer 330 may also be formed on a portion of the top surface of the second substrate 100, sidewalls of the first and second source conductive patterns SCP1 and SCP2, sidewalls of the interlayer dielectric layers 120, and sidewalls of the first, second, and third upper dielectric layers 220, 230, and 240, which portion and sidewalls are exposed to the second opening OP2. The barrier layer 330 may be formed of metal oxide, for example, aluminum oxide ($Al_xO_y$).

Gate electrodes EL may be formed to fill internal spaces surrounded by the barrier layer 330 in the second gap regions GR2. Pad portions ELp of the gate electrodes EL may be formed in internal spaces of the second gap regions GR2 adjacent to the planarized dielectric layer 210.

Afterwards, a second separation pattern SP2 may be formed to fill an internal space of the second opening OP2 surrounded by the barrier layer 330 and the gate electrodes EL. The second separation pattern SP2 may be formed of, for example, silicon oxide. The second separation pattern SP2 may have a top surface substantially coplanar with that of the third upper dielectric layer 240.

Figure 24:
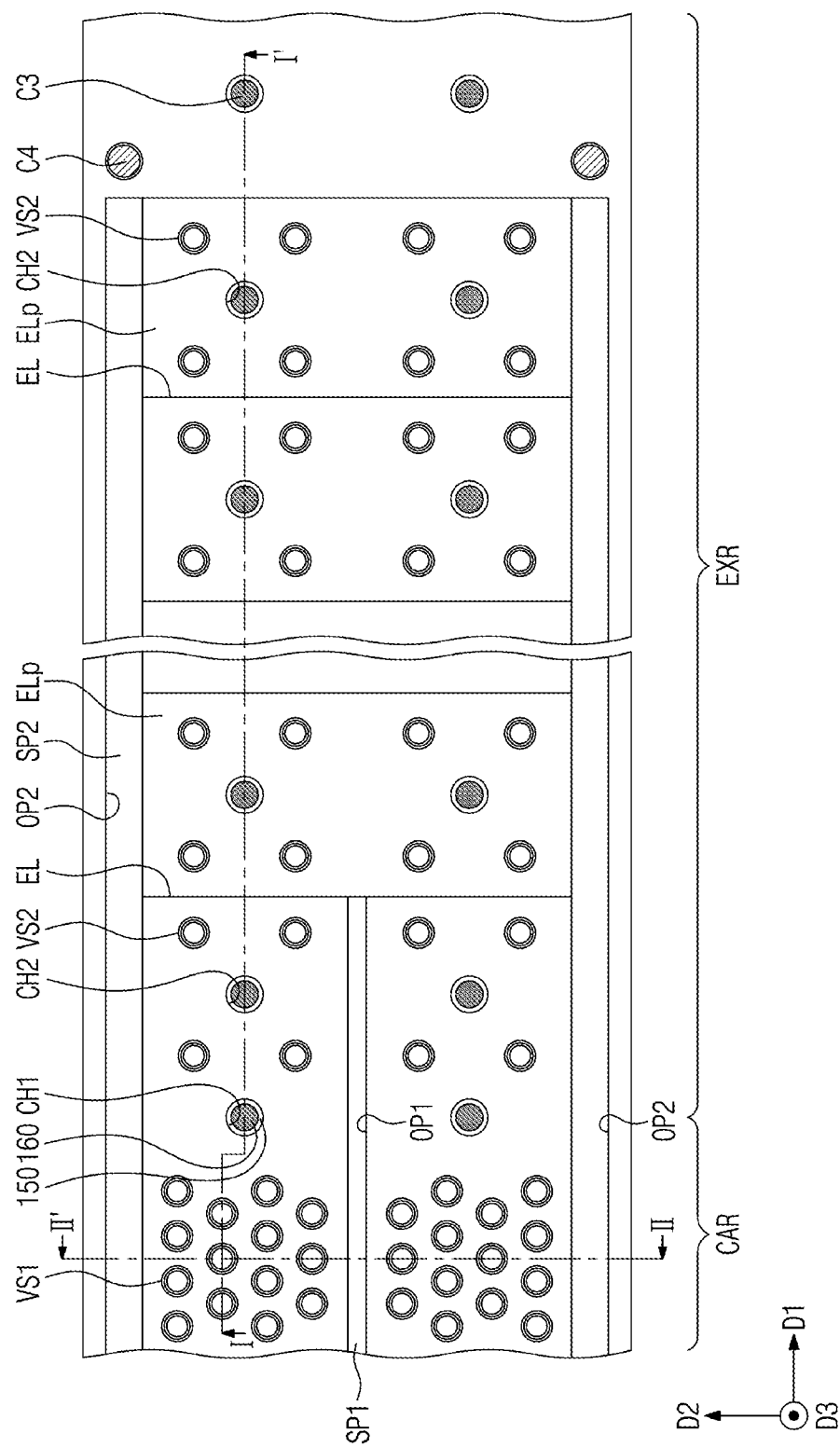
FIG. 24 illustrates a plan view showing a three-dimensional semiconductor memory device according to some embodiments of the present inventive concepts.
Figure 25:
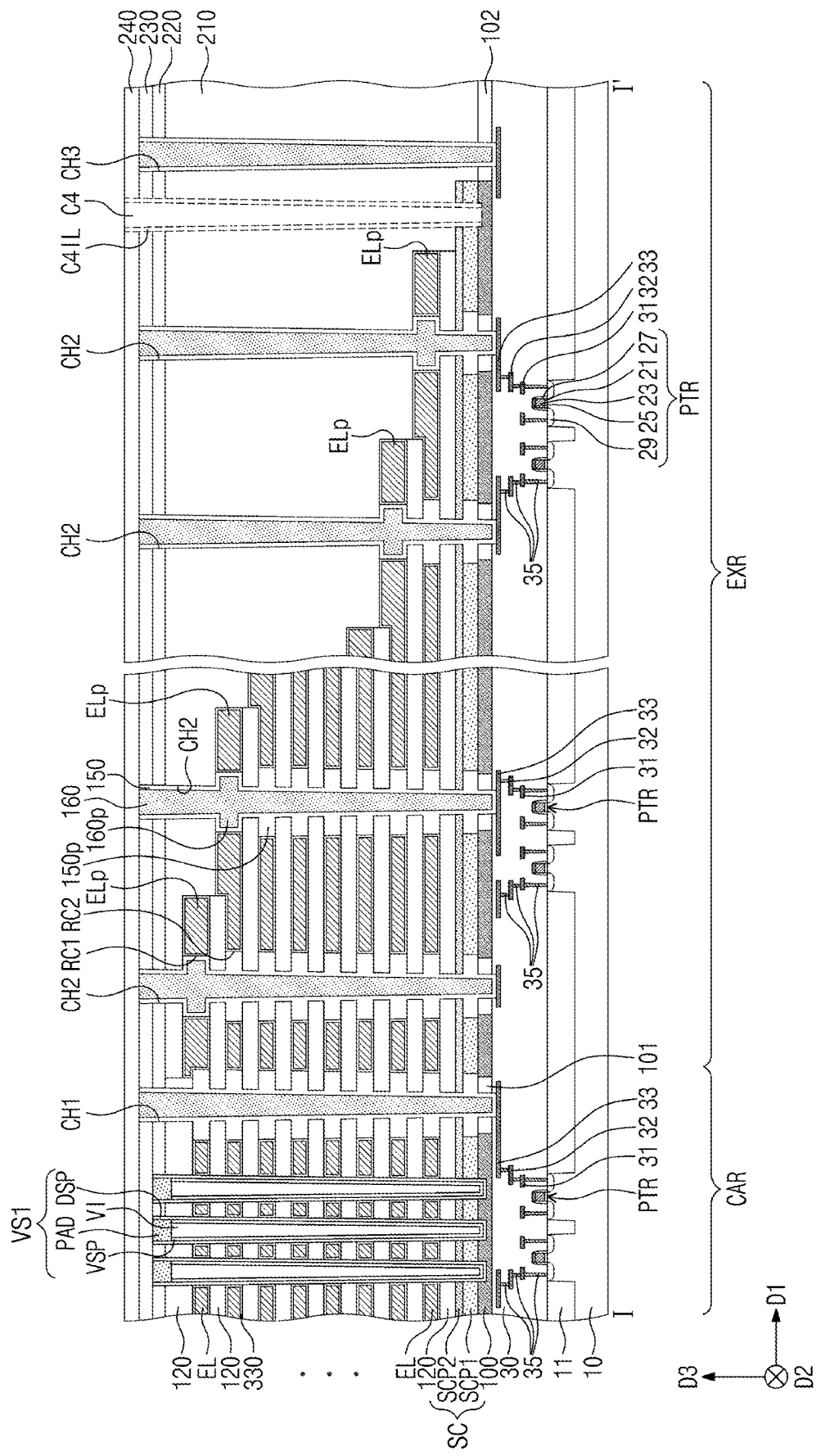
FIGS. 25 to 27 illustrate cross-sectional views taken along line I-I' of FIG. 24, showing a method of fabricating a three-dimensional semiconductor memory device according to some embodiments of the present inventive concepts.
Figure 26:
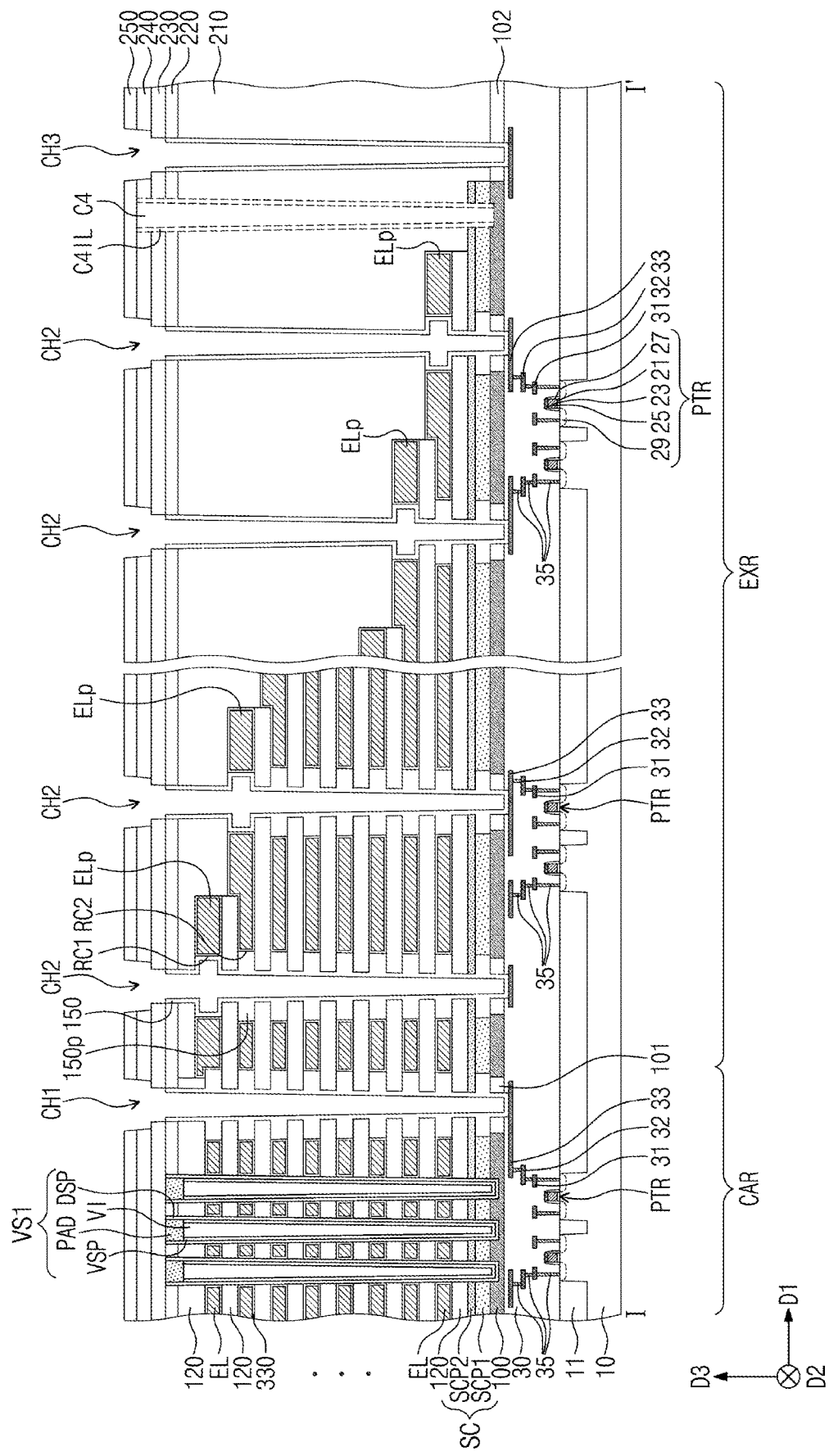
Figure 27:
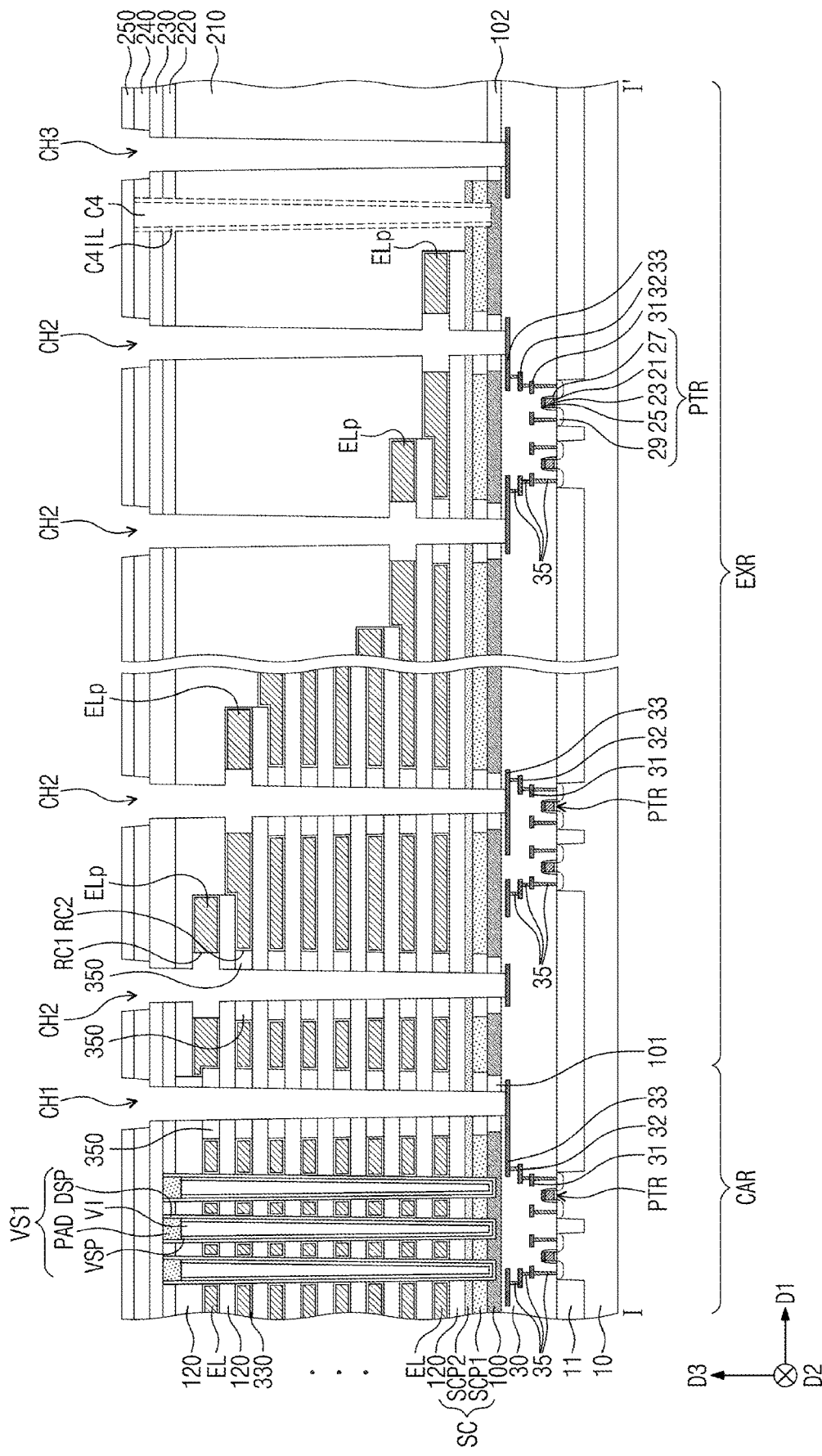

FIG. 24 illustrates a plan view showing a three-dimensional semiconductor memory device according to some example embodiments of the present inventive concepts. FIGS. 25 to 27 illustrate cross-sectional views taken along line I-I' of FIG. 24, showing a method of fabricating a three-dimensional semiconductor memory device according to some embodiments of the present inventive concepts.

Referring to FIGS. 24 and 25, a fourth contact C4 may be formed which is adjacent to the second separation pattern SP2. The fourth contact C4 may be spaced apart in the first direction D1 from the second separation pattern SP2. The fourth contact C4 may be formed by forming a hole that penetrates the first, second, and third upper dielectric layers 220, 230, and 240, the planarized dielectric layer 210, and the source structure SC, forming a contact dielectric layer C4IL that conformally covers a sidewall of the hole, and allowing a conductive material to fill an inside surrounded by the contact dielectric layer C4IL in the hole. The fourth contact C4 may be substantially coplanar with that of the third upper dielectric layer 240.

Referring back to FIGS. 25 and 26, a fourth upper dielectric layer 250 may be formed on the third upper dielectric layer 240.

Afterwards, the first, second, and third channel holes CH1, CH2, and CH3 may be formed. The first, second, and third channel holes CH1, CH2, and CH3 may be formed by forming openings that penetrate the third and fourth upper dielectric layers 240 and 250, and then removing the gap-fill sacrificial layer 160 exposed to the openings. The removal of the gap-fill sacrificial layer 160 may include performing, for example, a wet etching process that uses hydrofluoric acid (HF) and/or phosphoric acid ($H_3PO_4$). The protruding part 160p of the gap-fill sacrificial layer 160 in the first recession RC1 may be completely removed.

Referring to FIGS. 26 and 27, the first spacer layer 150 exposed to the first, second, and third channel holes CH1, CH2, and CH3 may be partially removed. The partial removal of the first spacer layer 150 may cause the first and second channel holes CH1 and CH2 to expose sidewalls of the interlayer dielectric layers 120. The protruding part 150p of the first spacer layer 150 formed between the interlayer dielectric layers 120 may not be completely removed, and thus third dielectric patterns 350 may be formed. The third dielectric patterns 350 may be other portions of the first spacer layer 150 that remain without being removed. In addition, the first spacer layer 150 covering the planarized dielectric layer 210 may be completely removed, and for example, the first spacer layer 150 may not remain in the third channel holes CH3.

The first spacer layer 150 in the first recession RC1 may be completely removed, and additionally, the barrier layer 330 exposed to the first recession RC1 may be partially removed. As a result, the second channel holes CH2 may expose sidewalls of the pad portions ELp of the gate electrodes EL.

Referring back to FIGS. 5 and 6, first, second, and third contacts C1, C2, and C3 may be formed to fill the first, second, and third channel holes CH1, CH2, and CH3. The first, second, and third contacts C1, C2, and C3 may be formed of a conductive material. The first, second, and third contacts C1, C2, and C3 may have their top surfaces substantially coplanar with that of the fourth upper dielectric layer 250.

Bit-line contact plugs BCP and first, second, third, and fourth contact plugs CP1, CP2, CP3, and CP4 may be formed on the fourth upper dielectric layer 250. Bit lines BL may be formed on the bit-line contact plugs BCP, and first, second, third, and fourth conductive lines CL1, CL2, CL3, and CL4 may be respectively formed on the first, second, third, and fourth contact plugs CP1, CP2, CP3, and CP4. A fifth upper dielectric layer 260 may be formed on the fourth upper dielectric layer 250. The fifth upper dielectric layer 260 may cover the bit lines BL and the first, second, third, and fourth conductive lines CL1, CL2, CL3, and CL4.

A three-dimensional semiconductor memory device according to some embodiments of the present inventive concepts may be configured such that top and bottom surfaces of each of dielectric patterns having a single-layered structure may be connected to interlayer dielectric layers, and thus the interlayer dielectric layers may be reduced or prevented from being collapsed during fabrication processes, with the result that the three-dimensional semiconductor memory device may increase in stability and have improved electrical characteristics.

Although the present invention has been described in connection with some embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. A three-dimensional semiconductor memory device, comprising:
   a substrate comprising a cell array region and an extension region;
   a peripheral circuit structure comprising a plurality of peripheral transistors on the substrate;
   a stack structure comprising a plurality of interlayer dielectric layers and a plurality of gate electrodes that are alternately stacked on the peripheral circuit structure;
   a plurality of contacts that penetrate the stack structure on the extension region and are electrically connected with the plurality of peripheral transistors, each of the plurality of contacts comprising a protruding part and a vertical part, the protruding part contacting a sidewall of one of the plurality of gate electrodes, and the vertical part penetrating the stack structure;
   a plurality of dielectric patterns between the vertical part and respective sidewalls of the plurality of gate electrodes; and
   a barrier layer that conformally extends on a top surface and a bottom surface of each of the gate electrodes,
   wherein a top surface and a bottom surface of each of the plurality of dielectric patterns are respectively in contact with adjacent ones of the plurality of interlayer dielectric layers, and
   wherein the barrier layer extends along a sidewall of each of the dielectric patterns.

2. The three-dimensional semiconductor memory device of claim 1, wherein the protruding part extends in a first direction, and
   wherein a width of the protruding part in the first direction is less than a width of each of the plurality of dielectric patterns in the first direction.

3. The three-dimensional semiconductor memory device of claim 1, wherein each of the plurality of gate electrodes comprises a pad portion whose thickness is greater than a thickness of a first portion of the gate electrode between the pad portion and a respective one of the plurality of dielectric patterns.

4. The three-dimensional semiconductor memory device of claim 3, wherein each of the plurality of contacts penetrates the pad portion of a respective one of the plurality of gate electrodes, and
wherein the protruding part of each of the plurality of contacts is in contact with a sidewall of the pad portion of the respective one of the plurality of gate electrodes.

5. The three-dimensional semiconductor memory device of claim 3, wherein a difference between the thickness of the pad portion and the thickness of the first portion of the gate electrode is in a range of about 10 nm to about 20 nm.

6. The three-dimensional semiconductor memory device of claim 1, wherein the dielectric patterns are spaced apart from the gate electrodes across the barrier layer.

7. The three-dimensional semiconductor memory device of claim 1, wherein the barrier layer comprises metal oxide.

8. The three-dimensional semiconductor memory device of claim 1, wherein the barrier layer extends between each of the plurality of dielectric patterns and the respective sidewalls of the plurality of gate electrodes.

9. The three-dimensional semiconductor memory device of claim 1, wherein heights in a vertical direction of the plurality of contacts are the same.

10. The three-dimensional semiconductor memory device of claim 1, wherein each of the dielectric patterns comprises a single-layered structure comprising an oxide of a same material.

11. The three-dimensional semiconductor memory device of claim 1, wherein the peripheral circuit structure further comprises a plurality of peripheral contact plugs and a plurality of peripheral circuit lines that are electrically connected to the peripheral transistors, and
wherein the plurality of contacts are in contact with uppermost ones of the peripheral circuit lines, respectively.

12. The three-dimensional semiconductor memory device of claim 1, further comprising:
a source conductive pattern between the substrate and the stack structure; and
a plurality of vertical structures that penetrate the stack structure on the cell array region,
wherein each of the plurality of vertical structures comprises:
a data storage pattern adjacent to the stack structure; and
a vertical semiconductor pattern on the data storage pattern,
wherein the source conductive pattern is in contact with the vertical semiconductor pattern,
wherein the plurality of dielectric patterns is a first plurality of dielectric patterns, and
wherein the three-dimensional semiconductor memory device further comprises a second plurality of dielectric patterns between the vertical part of respective ones of the plurality of contacts and the source conductive pattern.

13. The three-dimensional semiconductor memory device of claim 12, wherein top surfaces of the plurality of contacts are at a first level that is farther from the substrate than a second level of top surfaces of the vertical structures.

14. The three-dimensional semiconductor memory device of claim 1, wherein a thickness of each of the plurality of dielectric patterns is greater than a thickness of a respective one of the plurality of gate electrodes that is adjacent to the dielectric pattern.

15. A three-dimensional semiconductor memory device, comprising:
a first substrate comprising a cell array region and an extension region;
a peripheral circuit structure comprising a plurality of peripheral circuit lines and a plurality of peripheral transistors on the first substrate;
a second substrate on the peripheral circuit structure; and
a cell array structure on the second substrate,
wherein the cell array structure comprises:
a stack structure comprising a plurality of interlayer dielectric layers and a plurality of gate electrodes that are alternately stacked on the second substrate;
a plurality of vertical structures that penetrate the stack structure on the cell array region;
a plurality of bit lines that are electrically connected to the plurality of vertical structures, respectively;
a plurality of contacts that penetrate the stack structure on the extension region and are in contact with the plurality of peripheral circuit lines;
a plurality of dielectric patterns between the plurality of contacts and sidewalls of the plurality of gate electrodes, respectively; and
a barrier layer that conformally extends on a top surface and a bottom surface of each of the gate electrodes,
wherein each of the plurality of contacts comprises:
a protruding part in contact with the sidewall of one of the gate electrodes; and
a vertical part that penetrates the stack structure,
wherein a top surface and a bottom surface of each of the plurality of dielectric patterns are respectively in contact with adjacent ones of the plurality of interlayer dielectric layers, and
wherein the barrier layer extends along a sidewall of each of the dielectric patterns.

16. The three-dimensional semiconductor memory device of claim 15, wherein the cell array structure further comprises a source conductive pattern between the second substrate and the stack structure,
wherein each of the plurality of vertical structures comprises a data storage pattern surrounded by the stack structure and a vertical semiconductor pattern surrounded by the data storage pattern, and
wherein the source conductive pattern is in contact with the vertical semiconductor pattern.

17. The three-dimensional semiconductor memory device of claim 15, wherein a sidewall of each of the vertical structures has a stepped profile at one or more positions.

18. An electronic system, comprising:
a main board;
a three-dimensional semiconductor memory device on the main board; and
a controller on the main board and electrically connected to the three-dimensional semiconductor memory device,
wherein the three-dimensional semiconductor memory device comprises:
a substrate comprising a cell array region and an extension region;
a peripheral circuit structure comprising a plurality of peripheral transistors on the substrate;

a stack structure comprising a plurality of interlayer dielectric layers and a plurality of gate electrodes that are alternately stacked on the peripheral circuit structure;

a plurality of contacts that penetrate the stack structure on the extension region and are electrically connected with the plurality of peripheral transistors, each of the plurality of contacts comprising a protruding part and a vertical part, the protruding part contacting a sidewall of one of the plurality of gate electrodes, and the vertical part penetrating the stack structure;

a plurality of dielectric patterns between the vertical part and respective sidewalls of the plurality of gate electrodes; and a barrier layer that conformally extends on a top surface and a bottom surface of each of the gate electrodes, wherein a top surface and a bottom surface of each of the plurality of dielectric patterns are respectively in contact with adjacent ones of the plurality of interlayer dielectric layers, and wherein the barrier layer extends along a sidewall of each of the dielectric patterns.

19. The electronic system of claim 18, wherein each of the plurality of gate electrodes comprises a pad portion whose thickness is greater than a thickness of a first portion of the gate electrode between the pad portion and a respective one of the plurality of dielectric patterns, wherein each of the plurality of contacts penetrates the pad portion of a respective one of the plurality of gate electrodes, and wherein the protruding part of each of the plurality of contacts is in contact with a sidewall of the pad portion of the one of the plurality of gate electrodes.

* * * * *